US010778213B2

(12) United States Patent
Tateishi et al.

(10) Patent No.: US 10,778,213 B2
(45) Date of Patent: Sep. 15, 2020

(54) DRIVING CIRCUIT FOR OUTPUT TRANSISTOR

(71) Applicant: ROHM CO., LTD., Kyoto-shi, Kyoto (JP)

(72) Inventors: Tetsuo Tateishi, Kyoso (JP); Hiroto Oshita, Kyoso (JP); Yuhei Yamaguchi, Kyoso (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/151,770

(22) Filed: Oct. 4, 2018

(65) Prior Publication Data

US 2019/0115914 A1 Apr. 18, 2019

(30) Foreign Application Priority Data

Oct. 5, 2017 (JP) ................................ 2017-194986
Oct. 5, 2017 (JP) ................................ 2017-194987
Oct. 2, 2018 (JP) ................................ 2018-187509

(51) Int. Cl.
*H03K 17/06* (2006.01)
*H03K 17/20* (2006.01)

(52) U.S. Cl.
CPC ........... *H03K 17/20* (2013.01); *H03K 17/063* (2013.01)

(58) Field of Classification Search
CPC ............................ H03K 17/063; H03K 17/20
USPC ...................... 326/82, 83; 327/108, 109, 110
See application file for complete search history.

(56) References Cited

U.S. PATENT DOCUMENTS 5,142,171 A * 8/1992 Nunogawa ....... H03K 17/08122 327/110
2001/0033157 A1* 10/2001 Wile .................... H03K 17/063 323/315
2009/0033405 A1* 2/2009 Yanagishima .......... H02M 1/08 327/427
2009/0085639 A1* 4/2009 Ueno ..................... H03K 3/037 327/333
2013/0285710 A1* 10/2013 Knoedgen ............ H03K 17/162 327/109
2017/0271195 A1* 9/2017 Hoyerby ............... H03F 3/2173

FOREIGN PATENT DOCUMENTS

JP 2017077145 A 4/2017

* cited by examiner

*Primary Examiner* — William Hernandez
(74) *Attorney, Agent, or Firm* — Cantor Colburn LLP

(57) ABSTRACT

A diving circuit drives an output transistor according to a control signal $S_{CTRL}$. The gate of the first transistor is biased. The source of the first transistor is coupled to an internal line. In the on period of the output transistor, the voltage of the internal line is applied to a control electrode of the output transistor. A voltage correction circuit controls the internal line so as to gradually lower the voltage $V_{REGB}$ of the internal line with time.

20 Claims, 22 Drawing Sheets

DRIVING CIRCUIT FOR OUTPUT TRANSISTOR

CROSS REFERENCE TO RELATED APPLICATION

The present application claims priority under 35 U.S.C § 119(e) to Japanese Application No. 2017-194986, filed on Oct. 5, 2017; Japanese Application No. 2017-194987, filed on Oct. 5, 2017; and Japanese Application No. 2018-187509, filed on Oct. 2, 2018, the entire contents of all three of which are also incorporated herein by reference.

BACKGROUND OF THE INVENTION

1. Field of the Invention

The present invention relates to a driving technique for a P-channel transistor or a PNP transistor.

2. Description of the Related Art

Switching regulators, inverters, converters, and relay driving circuits each include a switching output circuit such as a half-bridge circuit, full-bridge (H-bridge) circuit, or the like.

FIG. 1 is a circuit diagram showing a configuration of an output circuit 1 investigated by the present inventor. The output circuit 1 includes an output transistor $M_H$ and a driving circuit 2. The output transistor $M_H$ is configured as a P-channel MOSFET (Metal Oxide Semiconductor Field Effect Transistor), and arranged such that its source is coupled to an input terminal IN and its drain is coupled to an output terminal OUT. The driving circuit 2 controls a gate voltage $V_G$ of the output transistor $M_H$ according to a control signal $S_{CTRL}$.

With applications supporting a relatively low input voltage $V_{IN}$, typically, the gate voltage $V_G$ is switched between the input voltage $V_{IN}$ and the ground voltage $V_{GND}$. However, with applications supporting a high input voltage $V_{IN}$, typically, the gate voltage $V_G$ is switched between the input voltage $V_{IN}$ and a predetermined voltage $V_{REGB}$ ($=V_{IN}-\Delta V$) giving consideration to the gate breakdown voltage of the output transistor $M_H$ or the like. Here, ΔV corresponds to the amplitude of the gate-source voltage of the output transistor $M_H$, which is designed to be greater than the gate-source threshold value $V_{GS(th)}$ of the output transistor $M_H$. For example, ΔV is designed to be a value on the order of 5 V.

The driving circuit 2 includes a driver 4, a voltage source 6, and a level shifter 8. The voltage source 6 generates a power supply voltage (which will also be referred to as the "internal power supply voltage") $V_{REGB}$ that is lower than the input voltage $V_{IN}$ by a predetermined voltage ΔV. The input voltage $V_{IN}$ is supplied to the upper-side power supply terminal of the driver 4. The internal power supply voltage $V_{REGB}$ is supplied to the lower-side power supply terminal of the driver 4. The level shifter 8 level-shifts the control signal $S_{CTRL}$, defined such that its high level is set to the power supply voltage $V_{REG}$ and its low level is set to the ground voltage $V_{GND}$, to a control signal $S_{CTRL}'$, defined such that its high level is set to $V_{IN}$ and its low level is set to $V_{REGB}$, and supplies the control signal $S_{CTRL}'$ thus level-shifted to the driver 4. The driver 4 generates the gate voltage $V_G$ that changes in a range between the high level ($V_{IN}$) and the low level ($V_{REGB}$) according to the control signal $S_{CTRL}'$.

The voltage source 6 is configured as a source follower clamp circuit. Specifically, the first transistor $M_1$ receives, via its gate, a bias voltage $V_{BIAS}$ that is lower than the input voltage $V_{IN}$ by a predetermined voltage ($V_Z$). With the gate-source voltage of the first transistor $M_1$ as $V_{TH}$, the following relation holds true.

$$V_{REGB}=V_{IN}-V_Z+V_{TH}=V_{BIAS}+V_{TH}$$

That is to say, the amplitude ΔV of the gate-source voltage $V_{GS}$ of the output transistor $M_H$ is represented by $\Delta V=(V_Z-V_{TH})$.

First Problem

The above is the configuration of the output circuit 1. As a result of investigating the output circuit 1 shown in FIG. 1, the present inventors have come to recognize the following problem.

FIG. 2 is a diagram showing the input/output characteristics of the voltage source 6 shown in FIG. 1. Here, the horizontal axis represents the input voltage $V_{IN}$. FIG. 2 shows the input voltage $V_{IN}$ and the bias voltage $V_{BIAS}$ in addition to the internal power supply voltage $V_{REGB}$.

In order for the voltage source 6 to operate normally, the electric potential $V_{BIAS}$ at the gate of the first transistor $M_1$ is required to be higher than the saturation voltage $V_{SAT}$ of a current source 7.

$$V_{BIAS}>V_{SAT}$$

That is to say, in a case in which $V_{IN}$ is in a low voltage range as represented by $V_{IN}<V_{SAT}+V_Z$, the difference ΔV between $V_{IN}$ and $V_{REGB}$, i.e., the gate-source voltage $V_{GS}$ of the output transistor $M_H$, becomes low. In a case in which the gate-source voltage $V_{GS}$ of the output transistor $M_H$ is low, this leads to an increase in the on resistance $R_{ON}$ of the output transistor $M_H$, resulting in a problem of increased power loss.

In order to solve this problem, the present inventor has investigated a driving circuit shown in FIG. 3. FIG. 3 is a circuit diagram showing a driving circuit 2R according to a comparison technique. The driving circuit 2R includes a voltage reduction detection circuit 10 and a switch SW1. The voltage reduction detection circuit 10 compares the input voltage $V_{IN}$ with a predetermined threshold value so as to detect a voltage reduction state. The switch SW1 is arranged between the ground and a line where the internal power supply voltage $V_{REGB}$ is generated. When the switch SW1 is turned on in such a voltage reduction state, the internal power supply voltage $V_{REGB}$ is reduced to the ground voltage $V_{GND}$ (=0 V). This allows the ground voltage $V_{GND}$ to be supplied as the gate voltage $V_G$ of the output transistor $M_H$.

As another approach, instead of providing such a switch SW1, a method is conceivable in which a switch SW2 is provided between the gate of the output transistor $M_H$ and the ground, which is turned on when the input voltage comes to be in the voltage reduction state.

With the driving circuit 2R shown in FIG. 3, this arrangement allows the on resistance of the output transistor $M_H$ to be maintained at a small value even when the input voltage $V_{IN}$ becomes low. However, if the switch SW1 or otherwise the switch SW2 turns on due to an abnormal operation of the voltage reduction detection circuit 10 although the input voltage $V_{IN}$ is sufficiently high, an overvoltage is applied between the gate and the source of the output transistor $M_H$. This leads to degradation of the circuit reliability.

It should be noted that description has been made regarding an aspect of the problem directing attention to a state in which the input voltage $V_{IN}$ becomes low. However, the present invention is not restricted to such an application to the state in which the input voltage $V_{IN}$ becomes low.

Second Problem

FIG. 4 is a circuit diagram showing a configuration of an output circuit 1 investigated by the present inventor. The output circuit 1 includes an output transistor $M_H$ and a driving circuit 2. The output transistor $M_H$ is configured as a P-channel MOSFET (Metal Oxide Semiconductor Field Effect Transistor), and is arranged such that its source is coupled to the input terminal IN and its drain is coupled to the output terminal OUT. The driving circuit 2 controls the gate voltage $V_G$ of the output transistor $M_H$ according to a control signal $S_{CTRL}$.

With an application in which the input voltage $V_{IN}$ is relatively low, typically, the gate voltage $V_G$ is switched between the input voltage $V_{IN}$ and the ground voltage $V_{GND}$. However, with an application in which the input voltage $V_{IN}$ is relatively high, typically, the gate voltage $V_G$ is switched between the input voltage $V_{IN}$ and a predetermined voltage $V_{REGB}$ ($=V_{IN}-\Delta V$) giving consideration to the breakdown voltage of the output transistor $M_H$ or the like. It should be noted that $\Delta V$ is designed to be a value on the order of 4 to 5 V, which is higher than the gate-source threshold value $V_{GS(th)}$ of the output transistor $M_H$.

The driving circuit 2 includes a driver 4, a voltage source 6, and a level shifter 8. The voltage source 6 generates the power supply voltage $V_{REGB}$ that is lower than the input voltage $V_{IN}$ by the predetermined voltage $\Delta V$. The input voltage $V_{IN}$ is supplied to the upper-side power supply terminal of the driver 4. The power supply voltage $V_{REGB}$ is supplied to the lower-side power supply terminal of the driver 4. The level shifter 8 level-shifts the control signal $S_{CTRL}$, defined such that its high level is set to the power supply voltage $V_{DD}$ and its low level is set to the ground voltage $V_{GND}$, into a control signal $S_{CTRL}'$, defined such that its high level is set to $V_{IN}$ and its low level is set to $V_{REGB}$, and supplies the control signal $S_{CTRL}'$ thus level-shifted to the driver 4. The driver 4 generates the gate voltage $V_G$ that changes in a range between the high level ($V_{IN}$) and the low level ($V_{REGB}$) according to the control signal $S_{CTRL}'$.

The above is the configuration of the output circuit 1. As a result of investigating the output circuit 1 shown in FIG. 4, the present inventors have come to recognize the following problem. That is to say, when the output transistor $M_H$ is turned off, the current $I_1$ flows from the driver 4 to the gate of the output transistor $M_H$ as a source current. This charges the gate capacitance of the output transistor $M_H$, which raises the gate voltage $V_G$ to a value in the vicinity of $V_{IN}$.

Conversely, when the output transistor $M_H$ is turned on, the driver 4 draws the current $I_2$ from the gate of the output transistor $M_H$ as a sink current. This discharges the gate capacitance of the output transistor $M_H$, which lowers the gate voltage $V_G$ to a value in the vicinity of the power supply voltage $V_{REGB}$.

The sink current $I_2$ thus drawn by the driver 4 flows to the internal power supply line 10 where the power supply voltage $V_{REGB}$ is generated. This becomes a cause of fluctuation of the power supply voltage $V_{REGB}$. In order to suppress such fluctuation of the power supply voltage $V_{REGB}$, there is a need to provide a capacitor $C_1$ having a relatively large capacitance between the internal power supply line 10 and the input terminal IN. In a case in which the capacitor $C_1$ is integrated as an internal component of an IC (Integrated Circuit), this leads to an increased chip area, resulting in an increased cost. Otherwise, in a case in which the capacitor $C_1$ is configured as an external component of such an IC (Integrated Circuit), this involves an increase of the number of components. In addition, such an arrangement requires the IC to include an additional pin via which such an external capacitor $C_1$ is to be coupled to the internal power supply line 10.

SUMMARY OF THE INVENTION

The present invention has been made in order to solve such a problem. Accordingly, it is an exemplary purpose of an embodiment of the present invention to provide a driving circuit that allows an output transistor $M_H$ to have a small on resistance. Also, it is another exemplary purpose of an embodiment of the present invention to provide an output circuit that requires only a small-capacitance capacitor or an output circuit that requires no capacitor.

1. An embodiment of the present invention relates to a driving circuit structured to drive an output transistor arranged between an input terminal that receives an input voltage and an output terminal according to a control signal. The driving circuit comprises: an internal line; a first transistor having a control electrode such as a gate or a base being biased, and a first electrode such as a source or an emitter being coupled to the internal line; and a voltage correction circuit structured to control the internal line so as to gradually reduce a voltage of the internal line with time. In an on period of the output transistor, a voltage of the internal line is applied to the control electrode configured as a gate or otherwise a base of the output transistor.

Another embodiment of the present invention also relates to a driving circuit. The driving circuit comprises: an internal line coupled to a control electrode configured as a gate or otherwise a base of an output transistor; a first transistor having a control electrode such as a gate or a base being biased, and a first electrode such a source or an emitter being coupled to the internal line; a second transistor arranged between a second electrode such as a drain or a collector of the first transistor and a ground, and structured to turn on and off according to a control signal; a current source structured to draw an auxiliary current as a sink current from the internal line; and an impedance element arranged between the input terminal and the internal line.

Yet another embodiment of the present invention also relates to a driving circuit. The driving circuit comprises: an internal line; a first transistor having a control electrode such as a gate or a base being biased, and a first electrode such as a source or an emitter being coupled to the internal line; a driver comprising an upper-side power supply terminal coupled to the input terminal, a lower-side power supply terminal coupled to the internal line, and an output terminal coupled to a control electrode configured as a gate or otherwise a base of the output transistor, and structured to drive an output transistor according to a control signal; a current source structured to draw an auxiliary current as a sink current from the internal line; and an impedance element arranged between the input terminal and the internal line.

2. An embodiment of the present invention relates to a driving circuit structured to drive an output transistor arranged between an input terminal and an output terminal. The driving circuit comprises: a first transistor having a first electrode being coupled to a control electrode of the output transistor, and a control electrode being biased; a second transistor arranged between a second electrode of the first transistor and a ground, and structured to turn on in an on period of the output transistor; a third transistor arranged between the input terminal and the control electrode of the output transistor; and a sub-driver structured to turn on the third transistor in an off period of the output transistor. The sub-driver comprises: a second resistor arranged between the input terminal and a control electrode of the third transistor; a fourth transistor having a first electrode thereof being coupled to the control electrode of the third transistor, and a control electrode thereof being biased; and a fifth transistor arranged between a second electrode of the fourth transistor and the ground, and structured to turn on in the off period of the output transistor. The control electrode of the first transistor and the control electrode of the fourth transistor are biased by different voltage sources.

Another embodiment of the present invention relates to a semiconductor apparatus. The semiconductor apparatus may comprises an output transistor and any one of the above-described driving circuits each configured to drive the output transistor.

Yet another embodiment of the present invention relates to a vehicle. The vehicle may comprise a mechanical relay and a semiconductor apparatus structured to drive the mechanical relay.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
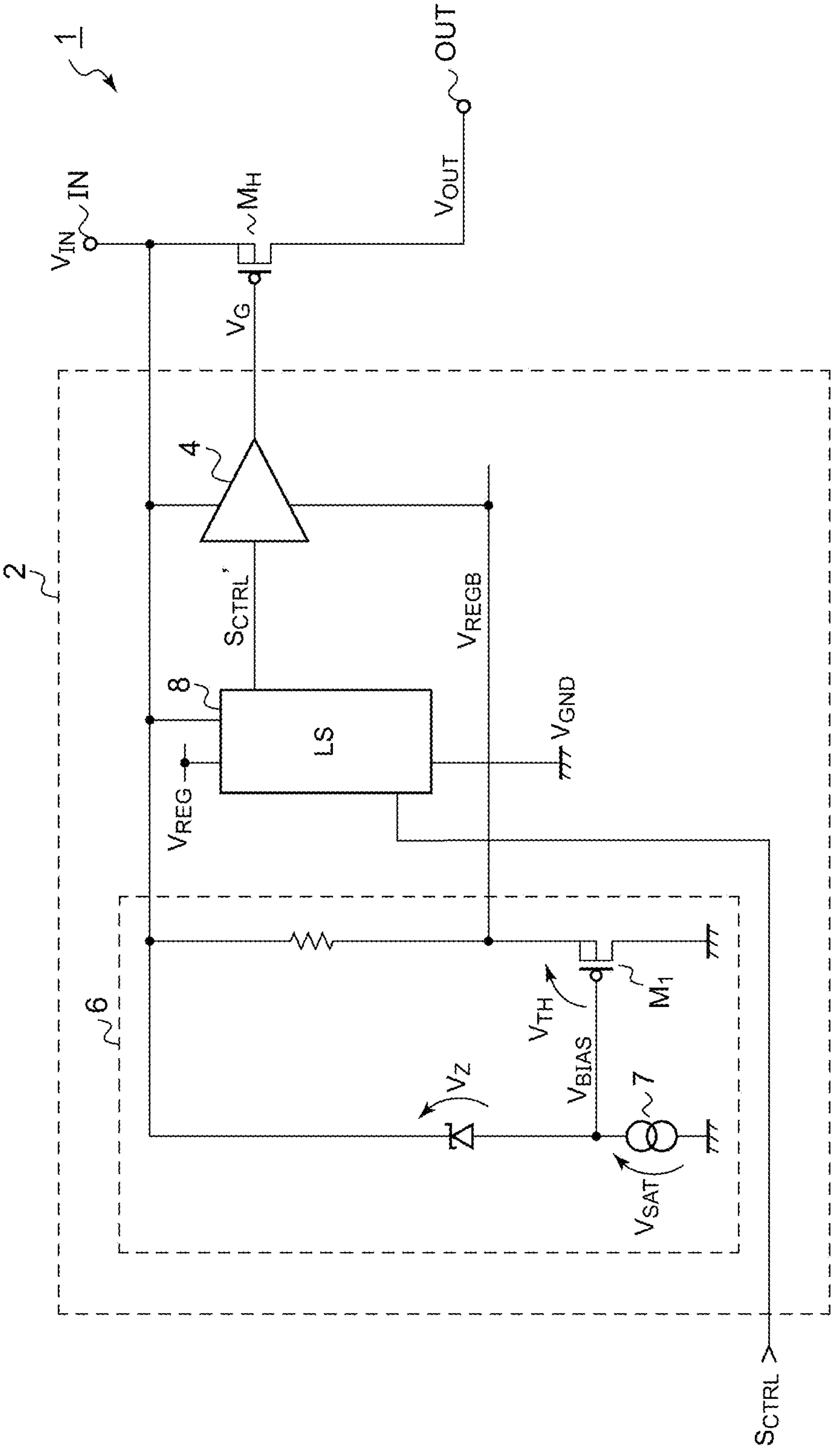
FIG. 1 is a circuit diagram showing a configuration of an output circuit investigated by the present inventor.

The invention will now be described based on preferred embodiments which do not intend to limit the scope of the present invention but exemplify the invention. All of the features and the combinations thereof described in the embodiment are not necessarily essential to the invention.

SUMMARY OF EMBODIMENTS

1. An embodiment disclosed in the present specification relates to a driving circuit structured to drive an output transistor arranged between an input terminal that receives an input voltage and an output terminal according to a control signal. The driving circuit comprises: an internal line; a first transistor having a control electrode such as a gate or a base being biased, and a first electrode such as a source or an emitter being coupled to the internal line; and a voltage correction circuit structured to control the internal line so as to gradually reduce a voltage of the internal line with time. In an on period of the output transistor, a voltage of the internal line is applied to the control electrode of the output transistor.

By reducing the voltage of the internal line by means of the voltage correction circuit, this arrangement is capable of lowering the low level of the gate voltage of the output transistor, thereby allowing the output transistor to have a small on resistance.

Also, the voltage correction circuit may comprise a current source that draws an auxiliary current as a sink current from the internal line. By drawing the charge from the internal line by means of the auxiliary current, this arrangement is capable of gradually lowering the voltage of the internal line with a slope that corresponds to the current amount.

With an embodiment, the driving circuit may further comprise a driver comprising an upper-side power supply terminal coupled to the input terminal, a lower-side power supply terminal coupled to the internal line, and an output terminal coupled to the control electrode of the output transistor, and structured to drive the output transistor according to the control signal.

With an embodiment, in an on period of the output transistor, the auxiliary current may be smaller than a sink current drawn by the driver from the control electrode of the output transistor. With this arrangement, the auxiliary current has no adverse effect on the turn-off of the normal switching operation.

With an embodiment, the driving circuit may further comprise a second transistor arranged between a second electrode such as a drain or a collector of the first transistor and a ground, and structured to turn on and off according to the control signal.

With an embodiment, in the on period of the output transistor, the auxiliary current may be smaller than a sink current drawn from the control electrode of the output transistor via the second transistor. With this arrangement, the auxiliary current has no adverse effect on the turn-off of the normal switching operation.

With an embodiment, the driving circuit may further comprise a third transistor arranged between the input terminal and the control electrode of the output transistor, and structured to turn on in a period in which the output transistor is to be turned off. Also, the auxiliary current may be smaller than a current that flows through the third transistor in an off period of the output transistor. With this arrangement, the auxiliary current has no adverse effect on the turn-off of the normal switching operation.

With an embodiment, the auxiliary current may be larger than the current that flows to the internal line in the off period of the output transistor in the low-voltage state.

Another embodiment disclosed in the present specification also relates to a driving circuit. The driving circuit comprises: an internal line coupled to a control electrode such as a gate or a base of an output transistor; a first transistor having a control electrode such as a gate or a base being biased, and a first electrode such as a source or an emitter being coupled to the internal line; a second transistor arranged between a second electrode such as a drain or a collector of the first transistor and a ground, and structured to turn on and off according to a control signal; a current source structured to draw an auxiliary current as a sink current from the internal line; and an impedance element arranged between the input terminal and the internal line.

With an embodiment, the auxiliary current may be larger than a current that flows through the impedance element, and may be smaller than a current that flows through the first transistor.

With an embodiment, the driving circuit may further comprise a third transistor arranged between the input terminal and the internal line, and structured to turn on and off in a complementary manner with respect to the second transistor according to the control signal.

Yet another embodiment disclosed in the present specification also relates to a driving circuit. The driving circuit comprises: an internal line; a first transistor having a control electrode such as a gate or a base being biased, and a first electrode such as a source or an emitter being coupled to the internal line; a driver comprising an upper-side power supply terminal coupled to the input terminal, a lower-side power supply terminal coupled to the internal line, and an output terminal coupled to a control electrode such as a gate or a base of an output transistor, and structured to drive the output transistor according to a control signal; a current source structured to draw an auxiliary current as a sink current from the internal line; and an impedance element arranged between the input terminal and the internal line.

With an embodiment, the auxiliary current may be larger than a current that flows through the impedance element, and may be smaller than a current that flows from the lower-side power supply terminal of the driver to the internal line.

With an embodiment, the driving circuit may further comprise a clamp circuit structured to clamp a voltage of the internal line such that a voltage difference between the voltage of the internal line and the input voltage does not exceed a predetermined value. Also, the clamp circuit may comprise a Zener diode arranged between the input terminal and the internal line.

With an embodiment, in the normal state of the input voltage, the control signal may be configured as a pulse signal. In the voltage reduction state in which the input voltage has fallen, the control signal may be configured as a DC signal that fixedly indicates the on state.

With an embodiment, the control signal may be configured as a pulse signal. The on-level time of the control signal may be increased according to a reduction of the input voltage.

Also, the auxiliary current may be turned on and off according to the control signal. Also, the auxiliary current may be fixedly set to the on level regardless of the level of the control signal.

With an embodiment, the driving circuit may further comprise a bias circuit structured to supply a bias voltage that is lower than the input voltage by a predetermined voltage width to the control electrode of the first transistor. The bias circuit may comprise a first Zener diode arranged between the input terminal and the control electrode of the first transistor and a current source arranged between the control electrode of the first transistor and the ground.

Also, the driving circuit may be monolithically integrated on a single semiconductor substrate. Examples of such an "integrated" arrangement include: an arrangement in which all the circuit components are formed on a semiconductor substrate; and an arrangement in which principal circuit components are monolithically integrated. Also, a part of the circuit components such as resistors and capacitors may be arranged in the form of components external to such a semiconductor substrate in order to adjust the circuit constants. By integrating the circuit as s single IC, such an arrangement allows the circuit area to be reduced, and allows the circuit elements to have uniform characteristics.

2. An embodiment disclosed in the present specification relates to a driving circuit structured to drive an output transistor arranged between an input terminal and an output terminal. The driving circuit comprises: a turn-off circuit structured to supply a current to a control electrode of the output transistor; a first transistor having its control electrode being coupled to a control electrode of the output transistor and its control electrode is biased; and a second transistor arranged between a second electrode of the first transistor and the ground and structured to turn on in an on period of the output transistor.

The first transistor functions as a source follower voltage clamp circuit or an emitter follower voltage clamp circuit. When the second transistor is turned on, the voltage at the control electrode of the output transistor is stabilized to a predetermined voltage. The discharging current drawn from the gate capacitance (base capacitance) of the first transistor when the first transistor is turned on flows to the ground via the first transistor and the second transistor. Accordingly, this arrangement is capable of suppressing fluctuation of the voltage at the control electrode of the output transistor.

With an embodiment, the turn-off circuit may comprise a third transistor arranged between the input terminal and the control electrode of the output transistor, and a sub-driver structured to turn on the third transistor in the off period of the output transistor.

By charging the capacitance of the control electrode of the output transistor via the third transistor when the output transistor is turned on, this arrangement is capable of raising the speed of the turn-off operation.

With an embodiment, the sub-driver may comprise a second resistor arranged between the input terminal and the control electrode of the third transistor, a fourth transistor having its first electrode coupled to the control electrode of the third transistor and its control electrode being biased, and a fifth transistor arranged between a second electrode of the fourth transistor and the ground and structured to be turned on in the off period of the output transistor.

This embodiment allows the low level of the driving voltage for the third transistor to be stabilized to a predetermined voltage With an embodiment, the control electrodes of the first transistor and the fourth transistor may each be biased by a common voltage source. When the second transistor is turned off, this leads to fluctuation of the electric potential at the control electrode of the first transistor due to the effect of the gate capacitance of the first transistor, which leads to fluctuation of the electric potential at the control electrode of the fourth transistor. In this state, when the fifth transistor is turned on, the fluctuation of the electric potential at the control electrode of the fourth transistor manifests as voltage fluctuation at the control electrode of the third transistor. When the voltage at the control electrode of the third transistor fluctuates, this has an adverse effect on the turn-off operation of the output transistor. Conversely, when the fifth transistor is turned off, this causes fluctuation of the electric potential at the control electrode of the fourth transistor due to the effect of the gate capacitance of the fourth transistor, which leads to fluctuation of the electric potential at the control electrode of the first transistor. In this state, when the second transistor is turned on, the fluctuation of the electric potential at the control electrode of the first transistor manifests as voltage fluctuation at the control electrode of the output transistor. In order to suppress the voltage fluctuation, a smoothing capacitor may preferably be coupled to the common voltage source.

With an embodiment, the control electrode of the first transistor and the control electrode of the fourth transistor may be biased by different voltage sources. In this case, the fluctuations at the control electrodes of the first transistor and the fourth transistor have no effect on each other. Accordingly, this arrangement requires no smoothing capacitor to suppress the fluctuation at the control electrode of the output transistor.

With an embodiment, the driving circuit may further comprise a first resistor arranged between the input terminal and the control electrode of the output transistor.

With an embodiment the driving circuit may further comprise: a first voltage source structured to supply a first bias voltage to the control electrode of the first transistor; and a second voltage source that is independent of the first voltage source, and that is structured to supply a second bias voltage to the control electrode of the fourth transistor. The first voltage source and the second voltage source may each have the same circuit configuration.

Also, the first voltage source may comprise a constant voltage element arranged between the input terminal and the control electrode of the first transistor. Also, the second voltage source may comprise a constant voltage element arranged between the input terminal and the control electrode of the fourth transistor.

Also, multiple the third transistors and multiple sub-drivers may be provided. Also, the fifth transistors of the multiple sub-drivers grouped for every two stages may be switched in a complementary manner. Also, the third transistor of a last stage may be arranged between the input terminal and the control electrode of the output transistor. Also, the other third transistors of the upstream stages of the last stage may each be arranged between the input terminal and the control electrode of the third transistor of the immediately downstream stage of the corresponding stage. Also, the control electrode of the first transistor and the control electrodes of the fourth transistors grouped for every two stages may each be biased by a common first voltage source. Also, the control electrodes of the other fourth transistors may each be biased by another common second voltage source.

Also, the driving circuit may be monolithically integrated on a single semiconductor substrate. Examples of such an "integrated" arrangement include: an arrangement in which all the circuit components are formed on a semiconductor substrate; and an arrangement in which principal circuit components are monolithically integrated. Also, a part of the circuit components such as resistors and capacitors may be arranged in the form of components external to such a semiconductor substrate in order to adjust the circuit constants. By integrating the circuit as s single IC, such an arrangement allows the circuit area to be reduced, and allows the circuit elements to have uniform characteristics.

EMBODIMENTS

Description will be made below regarding the present invention based on preferred embodiments with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

In the present specification, the state represented by the phrase "the member A is coupled to the member B" includes a state in which the member A is indirectly coupled to the member B via another member that does not substantially affect the electric connection between them, or that does not damage the functions or effects of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions or effects of the connection between them, in addition to a state in which they are directly coupled.

Embodiment 1

Figure 5:
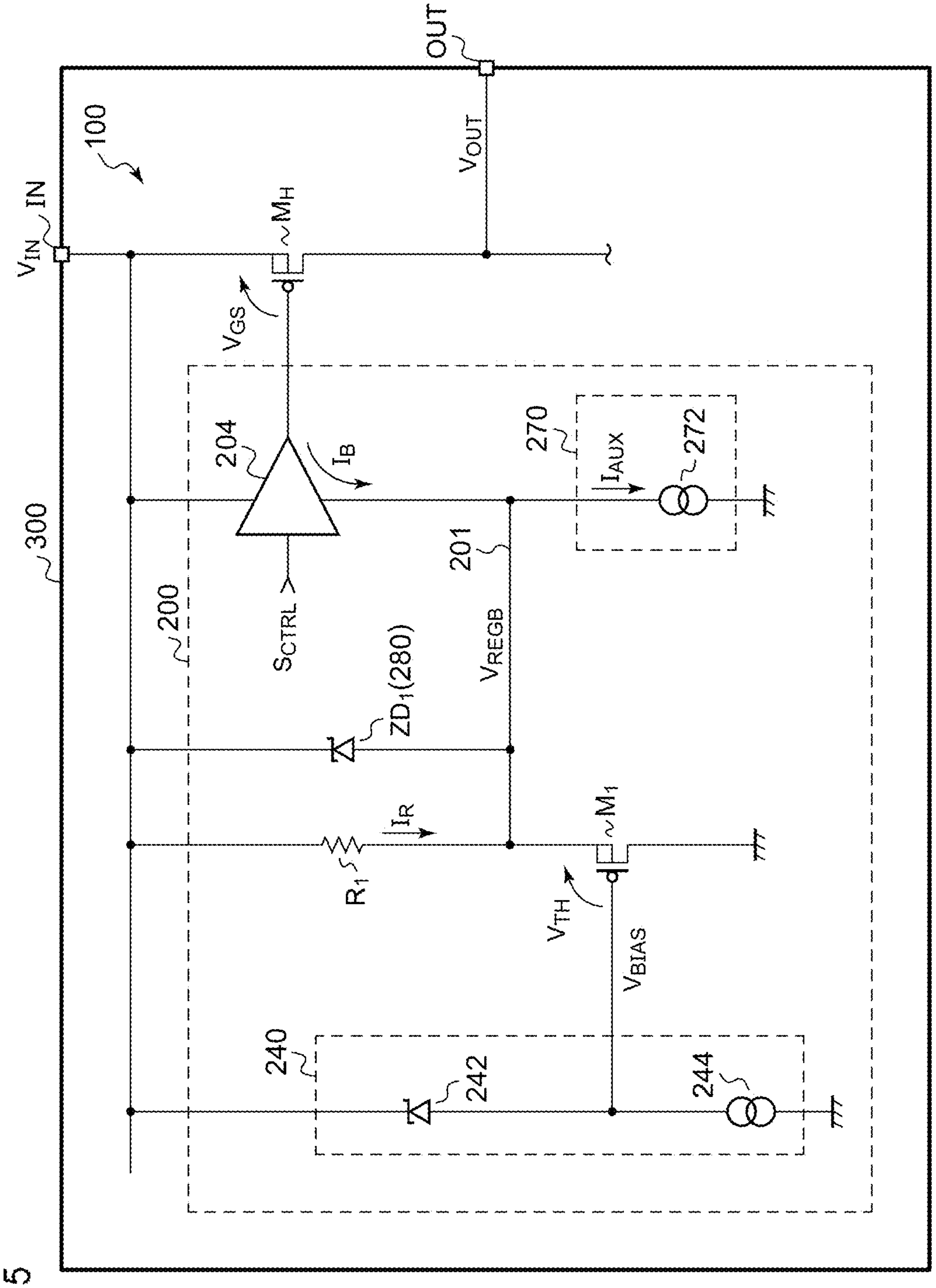
FIG. 5 is a circuit diagram showing an output circuit according to an embodiment 1.

FIG. 5 is a circuit diagram showing an output circuit 100 according to an embodiment 1. The output circuit 100 includes an output transistor $M_H$ and a driving circuit 200.

In the present embodiment, the output circuit 100 is configured as a component of a function IC (semiconductor device 300) integrated on a single semiconductor substrate.

The output transistor $M_H$ may be configured as an upper arm of a half-bridge circuit (single-phase inverter). Alternatively, the output transistor $M_H$ may be configured as an upper arm of a given leg of a full-bridge circuit or three-phase inverter. The output terminal OUT may be coupled to an inductive element such as an inductor, transformer, motor coil, relay coil, or the like. Also, the output transistor $M_H$ may be configured as a switching transistor of a step-down converter (buck converter).

The output transistor $M_H$ is arranged between the input terminal IN and the output terminal OUT. The output transistor $M_H$ is configured as a P-channel MOSFET, and is arranged such that its source is coupled to the input terminal IN and its drain is coupled to the output terminal OUT. The output transistor $M_H$ may be configured as a GaN FET, IGBT (Insulated Gate Bipolar Transistor), or PNP bipolar transistor.

The driving circuit 200 drives the output transistor $M_H$ according to the control signal $S_{CTRL}$. Specifically, when the control signal $S_{CTRL}$ is set to the on level (e.g., high level), the driving circuit 200 turns on the output transistor $M_H$. When the control signal $S_{CTRL}$ is set to the off level (e.g., low level), the driving circuit 200 turns off the output transistor $M_H$. Typically, the control signal $S_{CTRL}$ is configured as a pulse signal. However, the present invention is not restricted to such an arrangement. Also, the control signal $S_{CTRL}$ may be configured as a DC signal. The output voltage $V_{OUT}$ is generated at the output terminal OUT according to the control signal $S_{CTRL}$. Specifically, when the output transistor $M_H$ is turned on, the output voltage $V_{OUT}$ is set to the input voltage $V_{IN}$. When the output transistor $M_H$ is turned off, the output terminal OUT is set to the ground voltage $V_{GND}$ or otherwise the high-impedance state.

The driving circuit 200 mainly includes an internal line 201, a first transistor $M_1$, and a voltage correction circuit 270. First, description will be made regarding the components except for the voltage correction circuit 270.

The first transistor $M_1$ is configured as a P-channel MOSFET, and is arranged such that its gate (control electrode) is biased by a predetermined bias voltage (reference voltage) $V_{BIAS}$, and its source (first electrode) is coupled to the internal line 201. An impedance element $R_1$ is arranged between the input terminal IN and the internal line 201. The impedance element $R_1$ may be configured as a resistor, a current source, or an appropriately biased transistor.

The bias circuit 240 generates the bias voltage $V_{BIAS}$ that is lower than the input voltage $V_{IN}$ by a predetermined voltage. For example, the bias circuit 240 includes a constant voltage element 242 configured as a Zener diode and a current source 244. The bias voltage $V_{BIAS}$ represented by $V_{BIAS}=V_{IN}-V_Z$ is generated at a connection node that couples the constant voltage element 242 and the current source 244.

The first transistor $M_1$ functions as a source follower circuit. The internal power supply voltage $V_{REGB}$ applied to the internal line 201 is stabilized to a voltage value represented by $V_{REGB}=V_{BIAS}+V_{TH}=V_{IN}-V_Z+V_{TH}$.

The driving circuit 200 is configured such that, when it is set to the on state ($S_{CTRL}$=H), the internal power supply voltage $V_{REGB}$ of the internal line 201 is applied to the gate of the output transistor $M_H$.

In the embodiment 1, the driver 204 is provided. The driver 204 is arranged such that its upper-side power supply terminal is coupled to the input terminal IN, its lower-side power supply terminal is coupled to the internal line 201, and its output is coupled to the gate (control electrode) of the output transistor $M_H$.

Description has been made regarding an arrangement with the voltage correction circuit 270 omitted. Next, description will be made regarding the voltage correction circuit 270.

The voltage correction circuit 270 controls the internal line 201 so as to gradually reduce the voltage of the internal line 201. The voltage correction circuit 270 is set to the active state at least during the on period of the output transistor $M_H$ (period in which $S_{CTRL}$ is set to the high level). In the off period of the output transistor $M_H$, the voltage correction circuit 270 may be disabled (set to the high-impedance state) or otherwise may be maintained in the active state.

The voltage correction circuit 270 includes a current source 272 that draws an auxiliary current $I_{AUX}$ from the internal line 201. The configuration of the current source 272 is not restricted in particular. The current source 272 may include an appropriately biased transistor. Instead of such a current source, the voltage correction circuit 270 may be configured as a resistor.

The current amount of the auxiliary current is preferably designed to satisfy the following conditions.

Condition 1

The current amount of the auxiliary current $I_{AUX}$ is designed to be a small value such that it has no effect on the normal switching operation in a state in which the input voltage $V_{IN}$ is not low. Accordingly, the auxiliary current $I_{AUX}$ is designed to be sufficiently smaller than the sink current $I_B$ drawn by the driver 204 from the gate of the output transistor $M_H$ in the on period of the output transistor $M_H$ (period in which $S_{CTRL}$=H).

$$I_{AUX} \ll I_B$$

For example, $I_{AUX}$ is preferably designed to be a value on the order of 1/1000 to 1/200 of $I_B$.

Condition 2

Furthermore, the current amount of the auxiliary current $I_{AUX}$ is designed to be a large value so as to gradually reduce the internal power supply voltage $V_{REGB}$ at the internal line 201 with time in a state in which the input voltage $V_{IN}$ is low. For example, with the switching period in the normal operation as $T_P$, the current amount of the auxiliary current $I_{AUX}$ may preferably be designed so as to reduce the internal power supply voltage $V_{REGB}$ by $V_T$ for the switching period $T_P$ or a period that is longer than $T_P$.

Specifically, the auxiliary current $I_{AUX}$ is preferably designed to be larger than the current $I_R$ that flows into the internal line 201 in the off period of the output transistor $M_H$. The current $I_R$ is mainly configured as a current that flows through the impedance element $R_1$.

$$I_{AUX} > I_R$$

For example, the auxiliary current $I_{AUX}$ is preferably designed to be equal to or larger than 1.1 times $I_R$.

The output circuit 100 may further include a clamp circuit 280. The clamp circuit 280 is configured to clamp the internal power supply voltage $V_{REGB}$ of the internal line 201 such that the voltage difference between the internal power supply voltage $V_{REGB}$ and the input voltage $V_{IN}$ does not exceed a predetermined value. The configuration of the clamp circuit 280 is not restricted in particular. For example, the clamp circuit 280 may be configured as a constant voltage element such as a Zener diode $ZD_1$ arranged between the input terminal IN and the internal line 201.

The above is the configuration of the output circuit 100. Next, description will be made regarding the operation thereof.

1. High Input Voltage State

Figure 6:
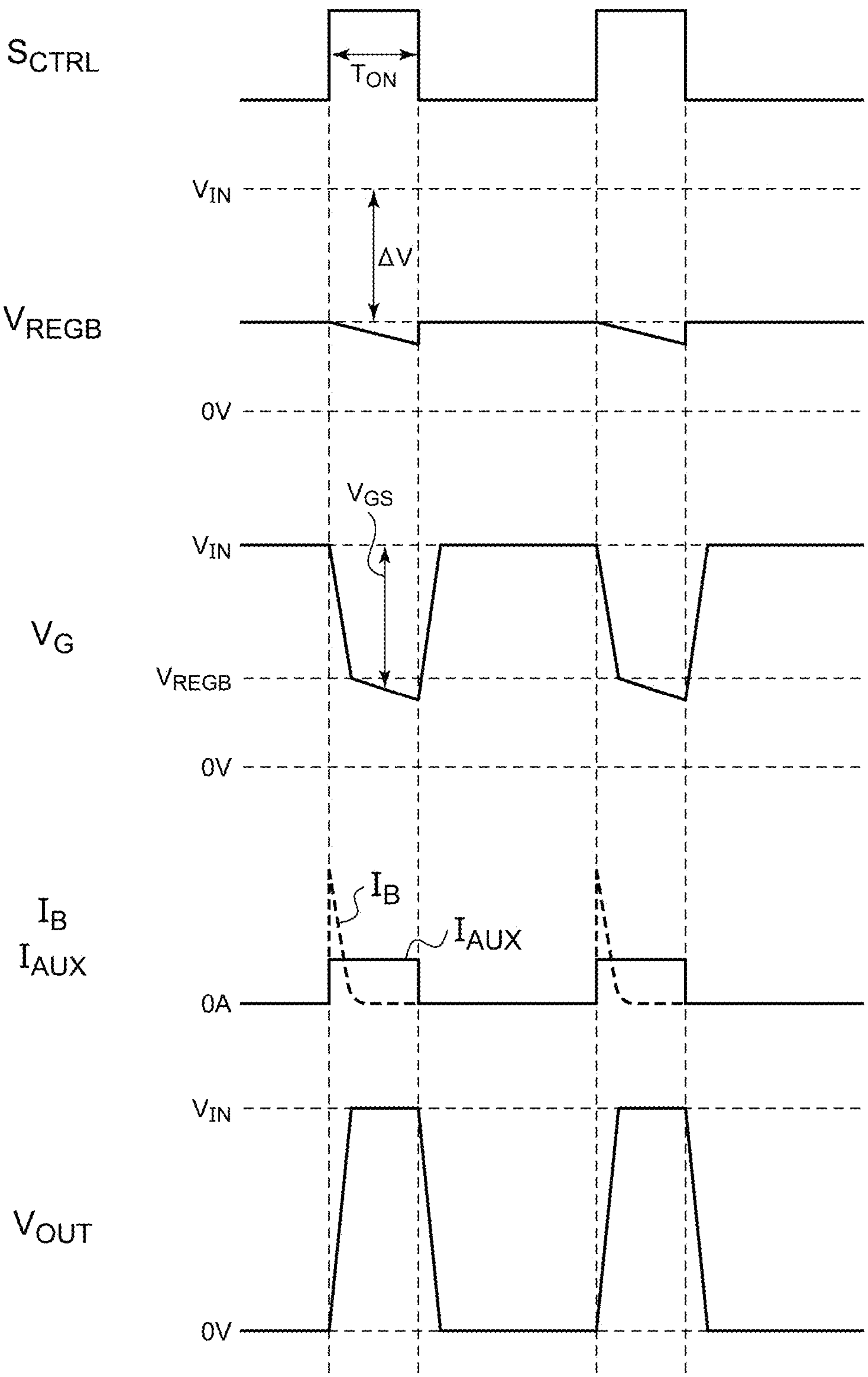
FIG. 6 is a diagram for explaining the operation of the output circuit shown in FIG. 5 when the input voltage $V_{IN}$ is high (non-low-voltage state)

FIG. 6 is a diagram for explaining the operation of the output circuit 100 shown in FIG. 5 when the input voltage $V_{IN}$ is high (in a non-low-voltage state). Description will be made regarding an example in which the auxiliary current $I_{AUX}$ is switched according to the control signal $S_{CTRL}$. When the input voltage $V_{IN}$ is high, the internal power supply voltage $V_{REGB}$ of the internal line 201 is stabilized by the first transistor $M_1$ to a value represented by the following expression. Here, ΔV is larger than the gate-source threshold voltage $V_{GS(th)}$ of the output transistor $M_H$.

$$V_{REGB} V_{IN}-\Delta V=V_{IN}-(V_Z-V_{TH})$$

When the control signal $S_{CTRL}$ is switched to the high level, the gate of the output transistor $M_H$ is discharged by the current $I_B$. This lowers the gate voltage $V_G$ to the internal power supply voltage $V_{REGB}$, thereby fully turning on the output transistor $M_H$.

Subsequently, the charge of the internal line 201 is discharged by the auxiliary current $I_{AUX}$ during the period in which the control signal $S_{CTRL}$ is set to the high level (on period $T_{ON}$). As a result, the voltage $V_{REGB}$ at of the internal line 201 is gradually discharged with time. It should be noted that $I_{AUX} \ll I_B$ holds true. Accordingly, the auxiliary current $I_{AUX}$ has no effect on the turn-on operation of the output transistor $M_H$.

Furthermore, in a state in which the input voltage $V_{IN}$ is high, the extent of the reduction in the internal power supply voltage $V_{REGB}$ is not excessively large in the on time $T_{ON}$ of the control signal $S_{CTRL}$ configured as a pulse signal. Accordingly, this arrangement ensures that the gate-source voltage $V_{GS}$ of the output transistor $M_H$ does not exceed the breakdown voltage thereof.

2. Low Input Voltage State (Voltage Reduction State)

Figure 7:
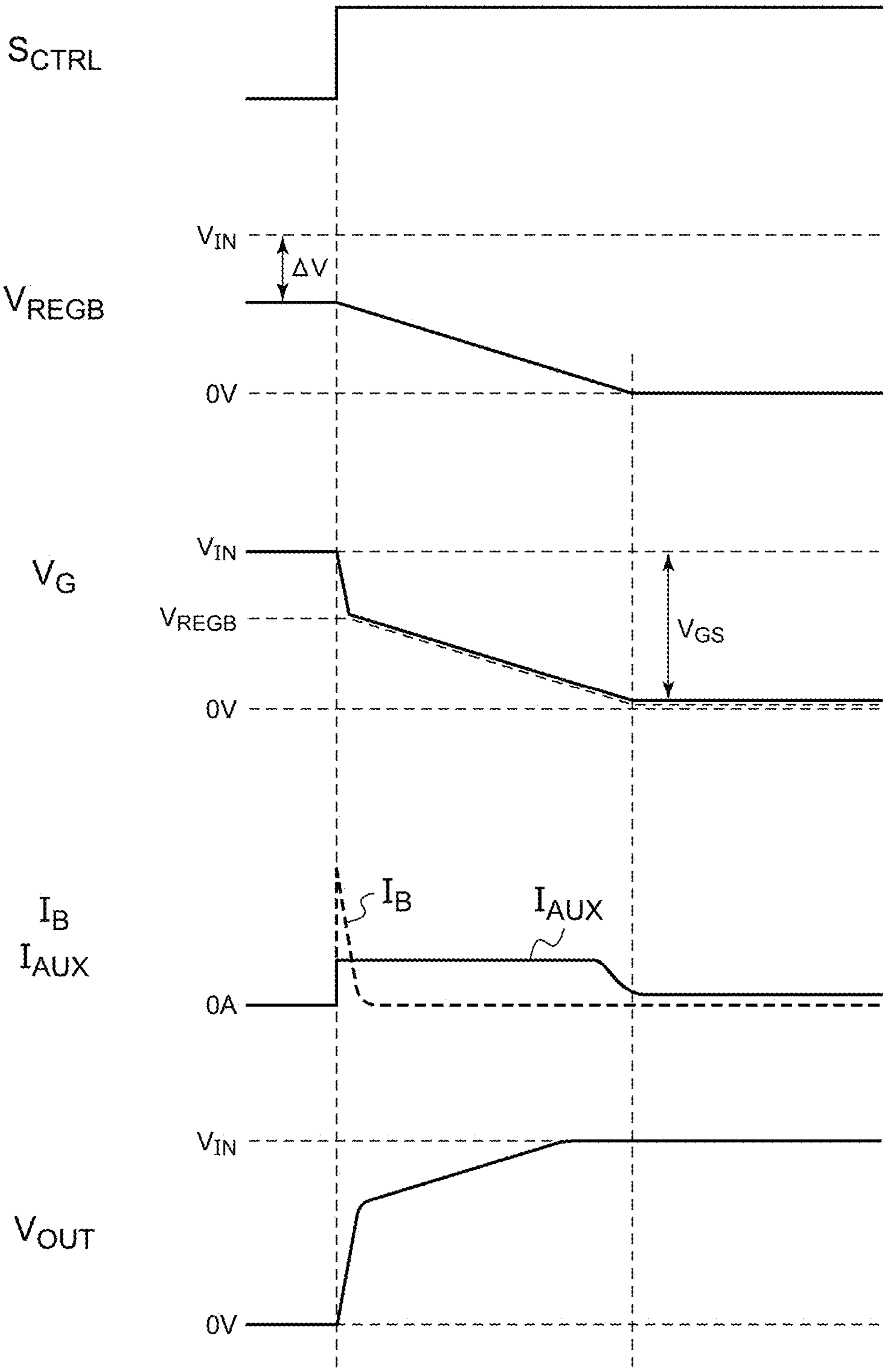
FIG. 7 is a diagram for explaining the operation of the output circuit shown in FIG. 5 when the input voltage $V_{IN}$ is low (low voltage range)

FIG. 7 is a diagram showing the operation of the output circuit 100 shown in FIG. 5 when the input voltage $V_{IN}$ is low (low voltage range). In this example, description will be made assuming that the control signal $S_{CTRL}$ is fixed to the on level (high level) in the low voltage range.

Figure 2:
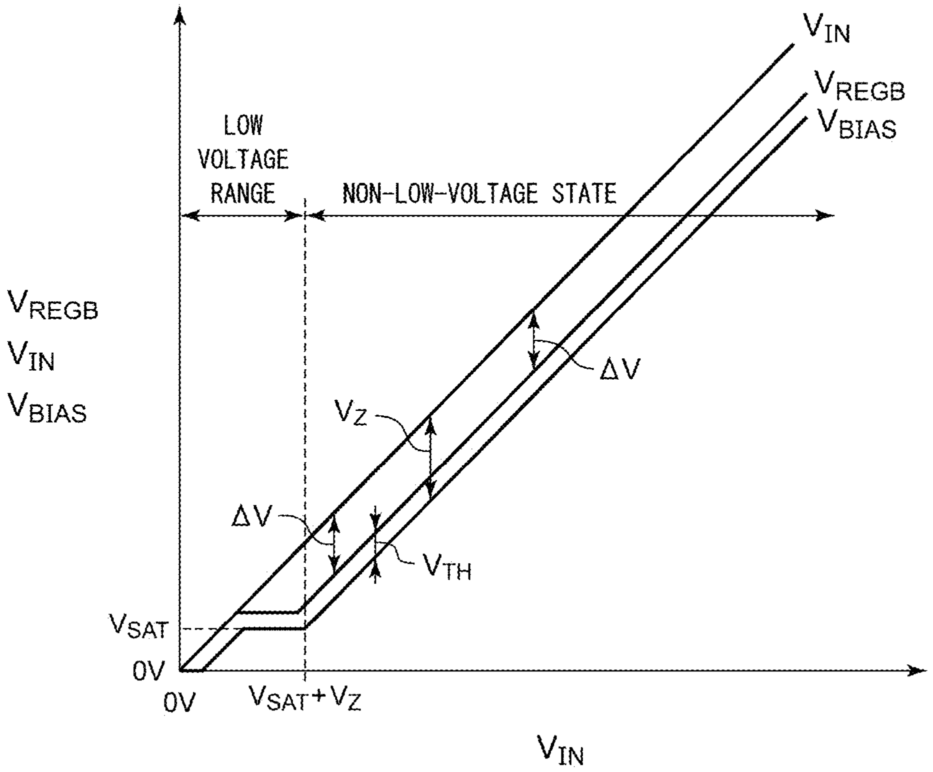
FIG. 2 is a diagram showing the input/output characteristics of a voltage source shown in FIG. 1.

As shown in FIG. 2, when the input voltage $V_{IN}$ enters the low voltage range, the difference ΔV between $V_{IN}$ and $V_{REGB}$ becomes small.

When the control signal $S_{CTRL}$ is switched to the high level, the gate of the output transistor $M_H$ is discharged due to the current $I_B$, which lowers the gate voltage $V_G$ to the internal power supply voltage $V_{REGB}$. It should be noted that ΔV, i.e., the gate-source voltage, is small. Accordingly, immediately after the turn-on operation, the output transistor $M_H$ is not able to fully turn on. As a result, the output voltage $V_{OUT}$ is lower than the input voltage $V_{IN}$.

Subsequently, the charge of the internal line 201 is discharged by the auxiliary current $I_{AUX}$ during a period in which the control signal $S_{CTRL}$ is set to the high level (on time $T_{ON}$). This gradually lowers the internal power supply voltage $V_{REGB}$ with time. In the low-voltage state, the on time $T_{ON}$ is set to a long time. Accordingly, the internal power supply voltage $V_{REGB}$ is lowered to a value in the vicinity of 0 V (or otherwise a level to be clamped by the clamp circuit 280), thereby increasing the voltage difference ΔV. As a result, the gate voltage $V_G$ of the output transistor $M_H$ is lowered, thereby lowering the on resistance of the output transistor $M_H$. Accordingly, the output voltage $V_{OUT}$ approaches the input voltage $V_{IN}$.

Figure 8:
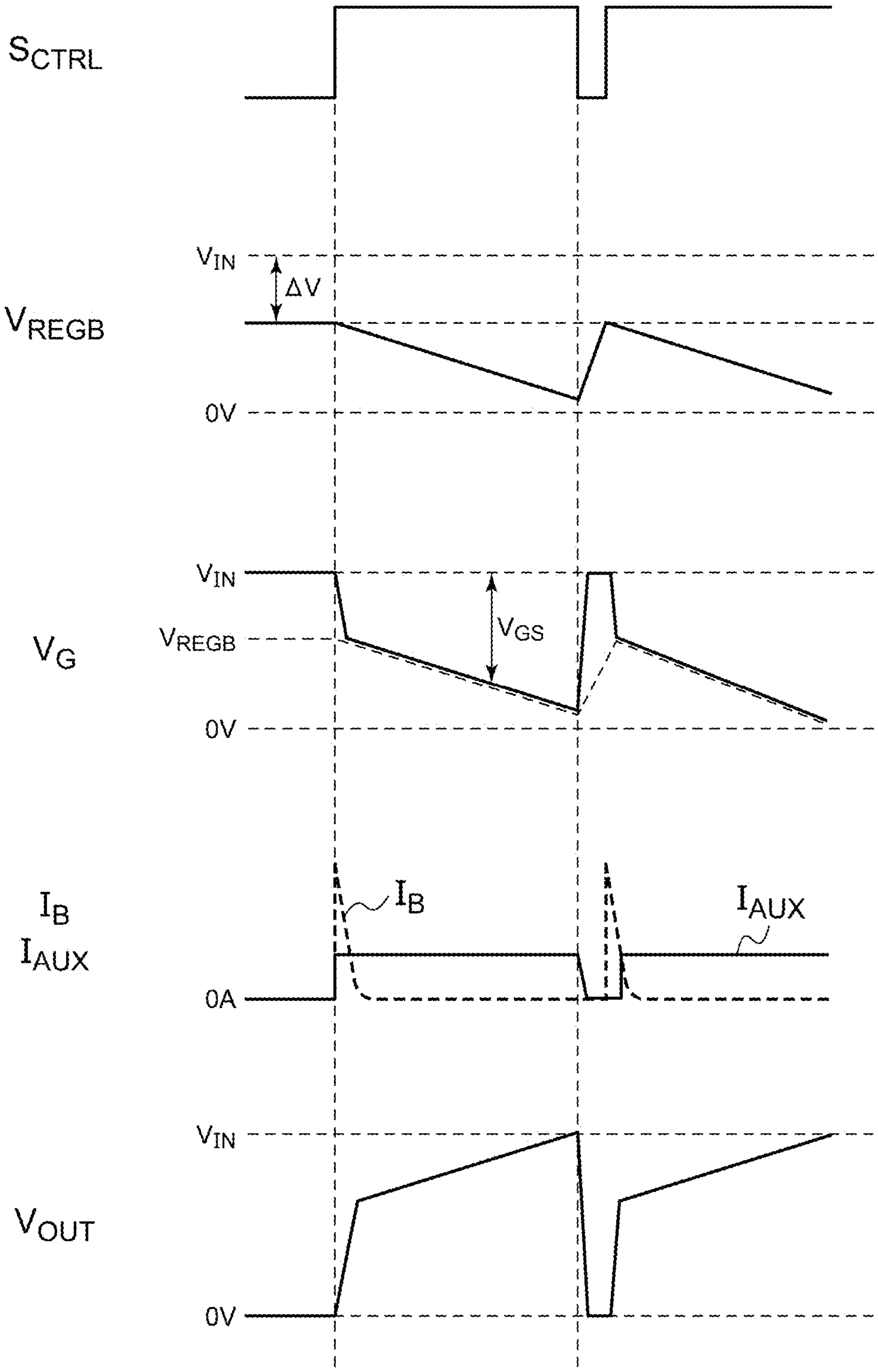
FIG. 8 is a diagram for explaining the operation of the output circuit shown in FIG. 5 when the input voltage $V_{IN}$ is low (low voltage range)

FIG. 8 is a diagram for explaining the operation of the output circuit 100 shown in FIG. 5 when the input voltage $V_{IN}$ is low (in the low voltage range). In this example, in the low voltage range, the control signal $S_{CTRL}$ is configured as a pulse signal having a large duty ratio. By supplying the control signal $S_{CTRL}$ with a large duty ratio, this arrangement provides the auxiliary current $I_{AUX}$ for a longer discharge time, thereby allowing the internal power supply voltage $V_{REGB}$ to be maintained at a value in the vicinity of 0 V. The operation shown in FIG. 7 can be regarded as the operation shown in FIG. 6 in a case in which the duty ratio of the control signal $S_{CTRL}$ is fixed to 100%.

It should be noted that, with the duty ratio of the control signal $S_{CTRL}$ as d, the effective voltage level of $V_{OUT}$ is represented by the following Expression.

$$V_{OUT}=V_{IN}\times d$$

With a platform that employs a control operation so as to maintain the effective voltage level of $V_{OUT}$ at a constant level, such a platform raises the duty ratio when the input voltage $V_{IN}$ becomes lower.

The above is the operation of the output circuit 100. With the output circuit 100, this arrangement allows the output transistor $M_H$ to have a small on resistance even in a situation in which the input voltage $V_{IN}$ is low. This allows power loss to be reduced.

Figure 3:
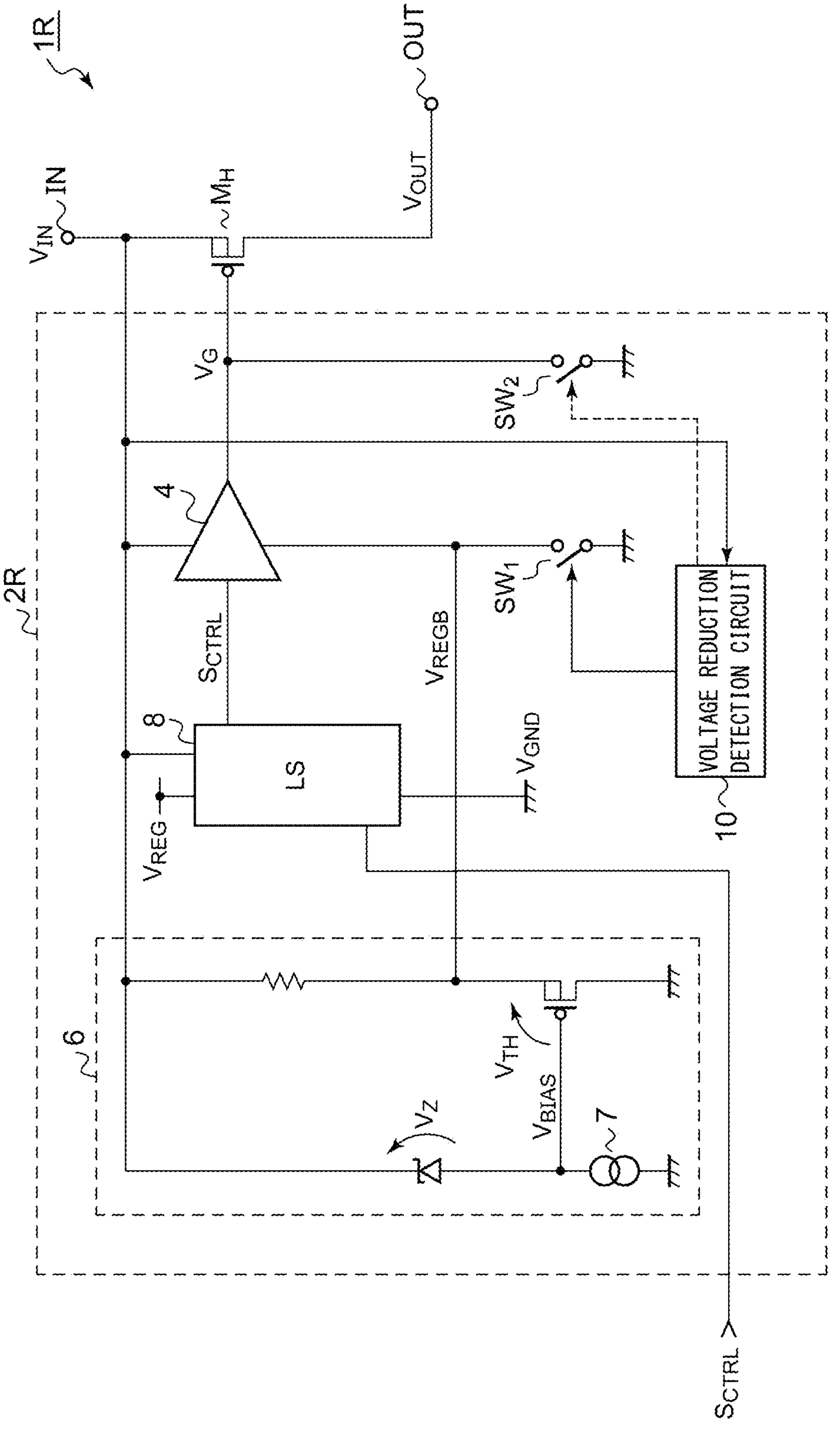
FIG. 3 is a circuit diagram showing a driving circuit according to a comparison technique.
Figure 4:
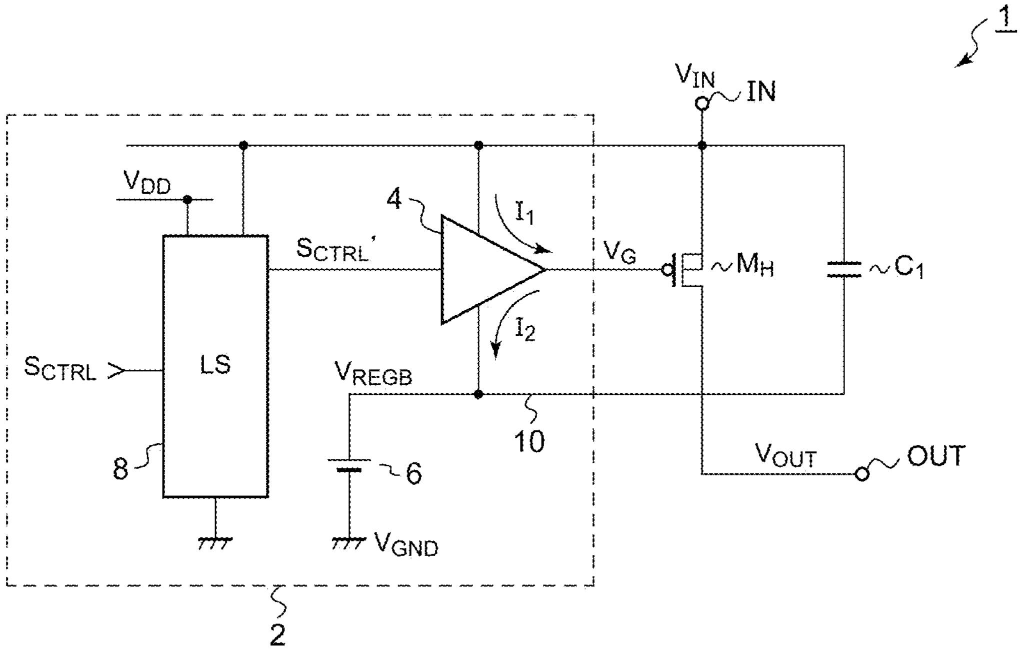
FIG. 4 is a circuit diagram showing a configuration of the output circuit investigated by the present inventor.

Furthermore, this arrangement does not require the voltage reduction detection circuit 10 shown in FIG. 3 in order to judge whether the voltage state is the low-voltage state or the non-low-voltage state. Accordingly, this arrangement does not involve a problem of excessive voltage applied between the gate and the source of the output transistor $M_H$ due to false detection of the low-voltage state.

It should be noted that, in a single platform, the voltage source may dynamically transit between the low-voltage state and the non-low-voltage state. That is to say, the voltage state may transit between the low-voltage state and the non-low-voltage state due to fluctuation of the input voltage $V_{IN}$.

Alternatively, in some cases, the semiconductor apparatus 300 may be employed in platforms employing different input voltages $V_{IN}$. In this case, in some cases, a given platform may operate in a low-voltage state at all times. In some cases, another platform may operate in a non-low-voltage state at all times. The present invention encompasses such embodiments.

Embodiment 2

Figure 9:
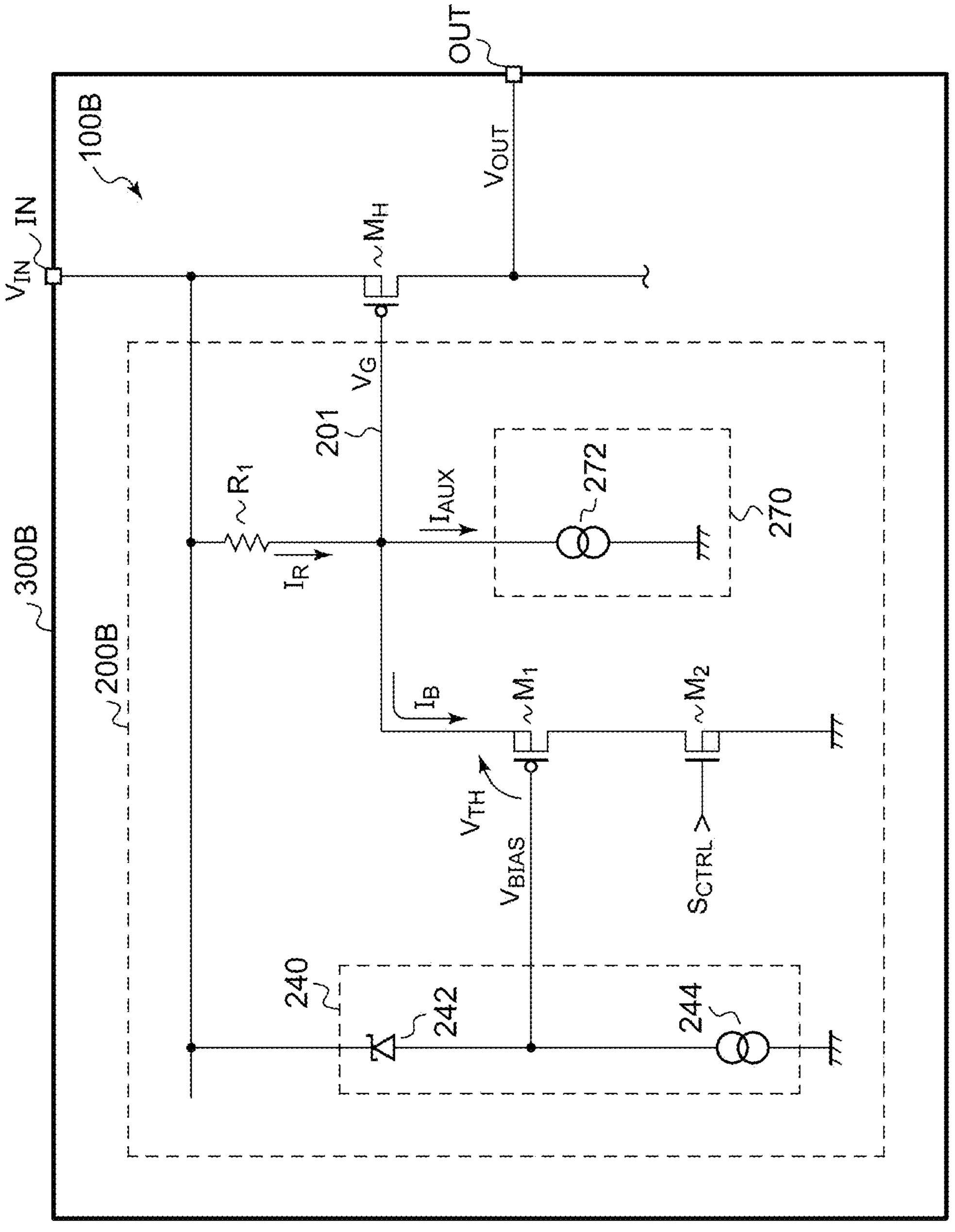
FIG. 9 is a circuit diagram showing an output circuit according to an embodiment 2.

FIG. 9 is a circuit diagram showing an output circuit 100B according to an embodiment 2. A driving circuit 200B includes a second transistor $M_2$ instead of the driver 204 shown in FIG. 5. In this embodiment, the source (first electrode) of the first transistor $M_1$, i.e., an internal line 201, is coupled to the gate of an output transistor $M_H$.

The second transistor $M_2$ is arranged between the drain (second electrode) of the first transistor $M_1$ and the ground. The second transistor $M_2$ turns on and off according to the control signal $S_{CTRL}$. More specifically, the second transistor $M_2$ is configured as an N-channel MOSFET, and is arranged between the drain of the first transistor $M_1$ and the ground. The second transistor $M_2$ is controlled such that, when the control signal $S_{CTRL}$ is set to the on level (high level), the second transistor $M_2$ is turned on.

A current source 272 draws an auxiliary current $I_{AUX}$ as a sink current from an internal line 201. An impedance element $R_1$ is arranged between an input terminal IN and the internal line 201.

The current amount of the auxiliary current $I_{AUX}$ is preferably designed so as to satisfy the following conditions.

[Condition 1]

The auxiliary current $I_{AUX}$ is designed to be sufficiently smaller than the discharging current $I_B$ drawn as a sink current from the gate of the output transistor $M_H$ via the first transistor $M_1$ and the second transistor $M_2$ in the on period of the output transistor $M_H$ (in the period in which $S_{CTRL}$=H).

$$I_{AUX} << I_B$$

For example, the auxiliary current $I_{AUX}$ may be designed to be a value on the order of 1/1000 to 1/200 of $I_B$.

[Condition 2]

The auxiliary current $I_{AUX}$ is designed to be smaller than the charging current $I_{R(HIGH)}$ that flows to the internal line 201 in the off period of the output transistor $M_H$ in the non-low-voltage state. The current $I_{R(HIGH)}$ is mainly configured as a current that flows through the impedance element $R_1$. With this arrangement, the auxiliary current $I_{AUX}$ has no effect on the turn-off operation.

$$I_{AUX} < I_{R(HIGH)}$$

Furthermore, the auxiliary current $I_{AUX}$ is designed to be larger than the current $I_{R(Low)}$ that flows to the internal line 201 in the on period of the output transistor $M_H$ in the low-voltage state. The current $I_{R(Low)}$ is mainly configured as a current that flows through the impedance element $R_1$.

$$I_{AUX} > I_{R(Low)}$$

The above is the configuration of the output circuit 100B. Next, description will be made regarding the operation thereof.

Figure 10:
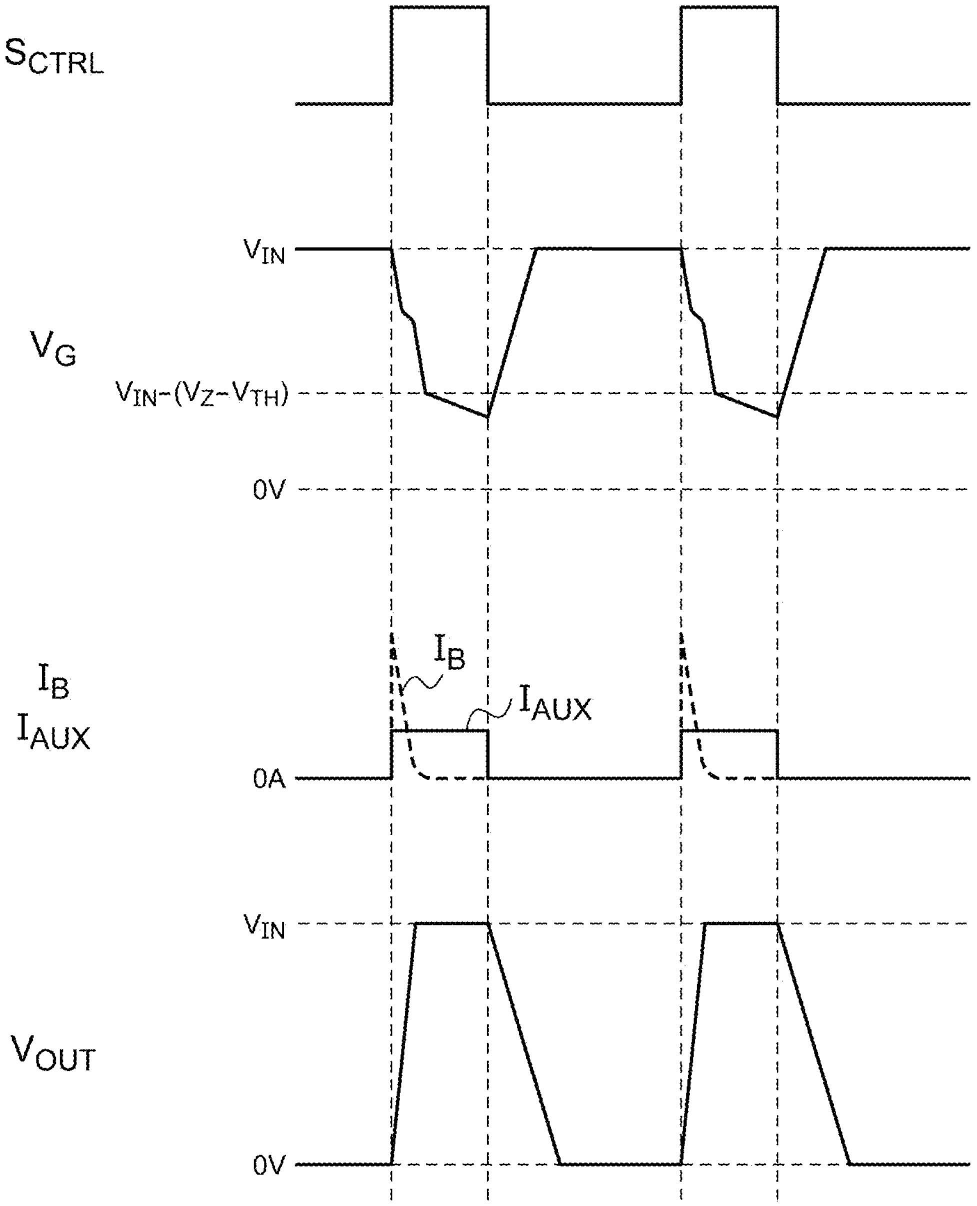
FIG. 10 is a diagram for explaining the operation of the output circuit shown in FIG. 9 when the input voltage $V_{IN}$ is high.

FIG. 10 is a diagram for explaining the operation of the output circuit 100B shown in FIG. 9 when the input voltage $V_{IN}$ is high. When the control signal $S_{CTRL}$ is set to the high level, the second transistor $M_2$ is turned on. As a result, the discharging current $I_B$ flows via the first transistor $M_1$ and the second transistor $M_2$. This discharges the charge from the internal line 201 (gate capacitance of the output transistor $M_H$), which lowers the gate voltage $V_G$. The first transistor $M_1$ functions as a source follower clamp circuit, which clamps the low level of the gate voltage $V_G$ to $V_{REGB}=V_{IN}-(V_Z-V_{TH})$.

Subsequently, during a period in which the control signal $S_{CTRL}$ is set to the high level (during the on period $T_{ON}$), the charge of the internal line 201 is discharged by the auxiliary current $I_{AUX}$, thereby gradually discharging the voltage $V_G$ of the internal line 201 with time. It should be noted that the relation $I_{AUX} << I_B$ holds true. Accordingly, the auxiliary current $I_{AUX}$ has no effect on the turn-on operation of the output transistor $M_H$.

In a state in which the input voltage $V_{IN}$ is high, the reduction of the internal power supply voltage $V_{REGB}$ is not very large in the on time $T_{ON}$ of the control signal $S_{CTRL}$ configured as a pulse signal. With such an arrangement, the gate-source voltage $V_{GS}$ does not exceed the breakdown voltage of the output transistor $M_H$.

When the control signal $S_{CTRL}$ is set to the low level, the second transistor $M_2$ is turned off. The gate capacitance of the output transistor $M_H$ is charged by the charging current $I_R$ that flows through the resistor $R_1$. This raises the gate voltage $V_G$, thereby turning off the output transistor $M_H$.

Figure 11:
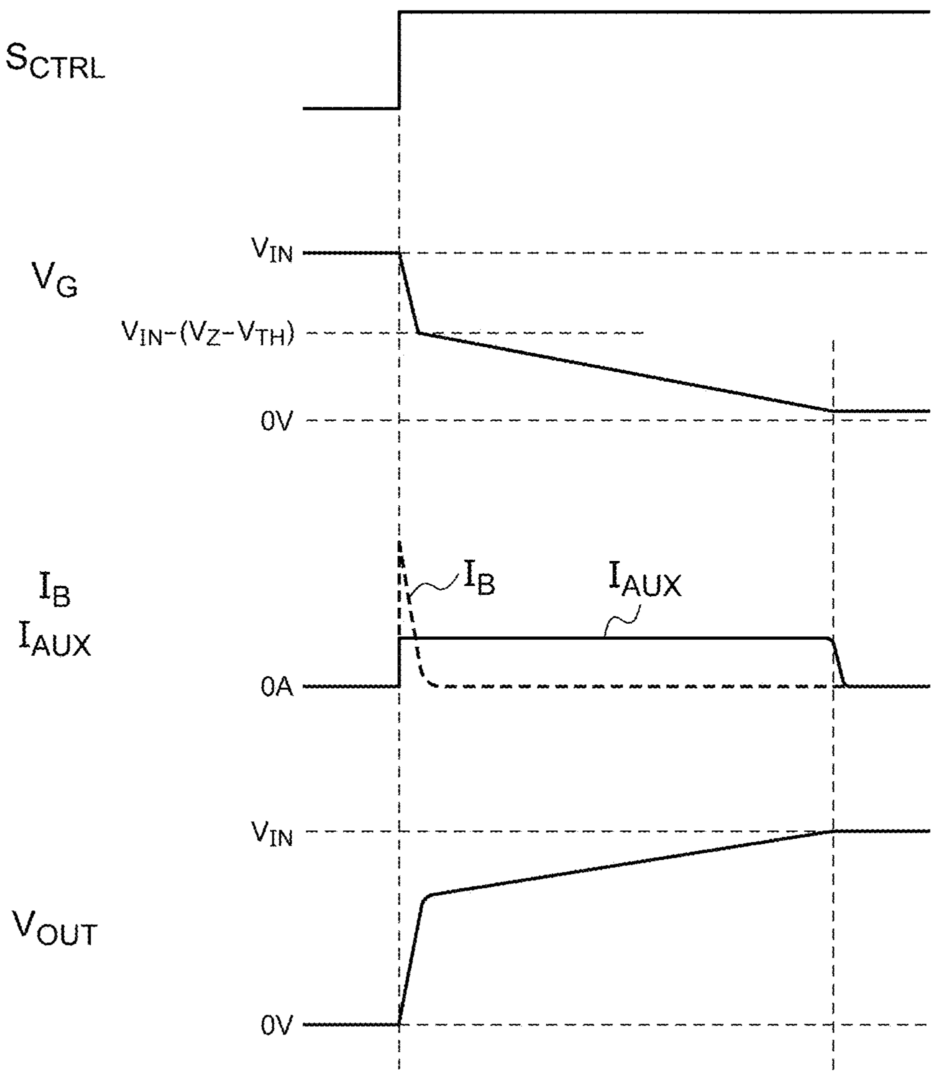
FIG. 11 is a diagram for explaining the operation of the output circuit shown in FIG. 9 when the input voltage $V_{IN}$ is low.

FIG. 11 is a diagram showing the operation of the output circuit 100B shown in FIG. 9 when the input voltage $V_{IN}$ is low. In this example, description will be made assuming that the duty ratio of the control signal $S_{CTRL}$ is set to 100% in the low-voltage state. When the control signal $S_{CTRL}$ is switched to the high level, the gate of the output transistor $M_H$ is discharged by the current $I_B$, which lowers the gate voltage $V_G$ to the internal power supply voltage $V_{REGB}$. It should be noted that $\Delta V$, i.e., the gate-source voltage, is low. Accordingly, immediately after the turn-on operation, the output transistor $M_H$ is not able to fully turn on. Accordingly, the output voltage $V_{OUT}$ is lower than the input voltage $V_{IN}$.

Subsequently, during a period in which the control signal $S_{CTRL}$ is set to the high level (during the on period $T_{ON}$), the charge of the internal line 201 is discharged by the auxiliary current $I_{AUX}$, which gradually lowers the gate voltage $V_G$ with time. In the low-voltage state, the on period $T_{ON}$ is set to a long period. Accordingly, the gate voltage $V_G$ is lowered to a value in the vicinity of 0 V (or otherwise a level to be clamped by the clamp circuit 280), thereby increasing the voltage difference $\Delta V$. As a result, the gate voltage $V_G$ of the output transistor $M_H$ is lowered, which lowers the on resistance of the output transistor $M_H$. Accordingly, the output voltage $V_{OUT}$ approaches the input voltage $V_{IN}$.

With the second embodiment 2, this arrangement is also capable of reducing the on resistance of the output transistor $M_H$ in the low-voltage state as with the first embodiment, thereby providing reduced power consumption.

Embodiment 3

Figure 12:
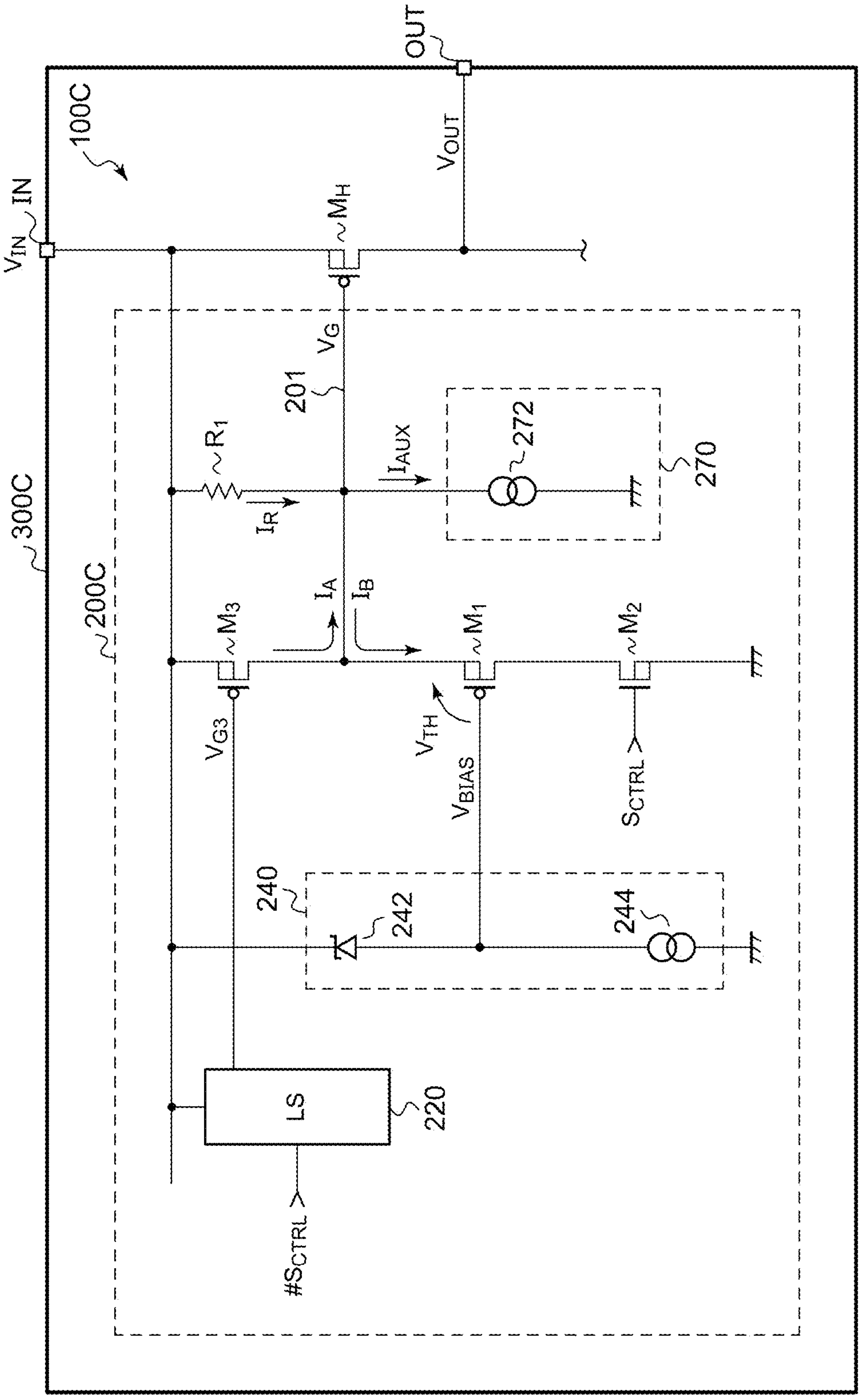
FIG. 12 is a circuit diagram showing an output circuit according to an embodiment 3.

FIG. 12 is a circuit diagram showing an output circuit 100C according to an embodiment 3. A driving circuit 200C further includes a third transistor $M_3$ and a sub-driver 220 in addition to the components of the output circuit 100B shown in FIG. 9.

The third transistor $M_3$ is arranged between the input terminal IN and the internal line 201. The third transistor $M_3$ is turned on and off in a complementary manner with respect to the second transistor $M_2$ according to the control signal $S_{CTRL}$. More specifically, the third transistor $M_3$ is configured as a P-channel MOSFET, and is arranged between the input terminal IN and the gate line 202.

The sub-driver 220 turns on the third transistor $M_3$ during an off period of the output transistor $M_H$ (during a period in which $S_{CTRL}$ is set to the low level). For example, the sub-driver 220 level-shifts the control signal $S_{CTRL}$ that switches between $V_{DD}$ and $V_{GND}$ to a gate signal $V_{G3}$ that switches between an appropriate high voltage and low voltage (e.g., between $V_{IN}$ and $V_{REGB}$). The low voltage $V_{REGB}$ may be the same as the low voltage of the gate voltage $V_G$ of the output transistor $M_H$.

The above is the configuration of the output circuit 100C. With the output circuit 100C, when the control signal $S_{CTRL}$ is set to the low level, the third transistor $M_3$ is turned on. This provides the current $I_A$ flowing through the third transistor $M_3$, which charges the gate capacitance of the output transistor $M_H$. This arrangement allows the turn-off time of the output transistor $M_H$ to be reduced as compared with the output circuit 100B, thereby allowing a high-speed switching operation.

It should be noted that, in the embodiment 3, the following conditions are preferably satisfied.

[Condition 1]

The auxiliary current $I_{AUX}$ is designed to be sufficiently smaller than the discharging current $I_B$ drawn as a sink current from the gate of the output transistor $M_H$ via the first transistor $M_1$ and the second transistor $M_2$ in the on period of the output transistor $M_H$ (in a period in which $S_{CTRL}$=H).

$$I_{AUX} << I_B$$

For example, the auxiliary current $I_{AUX}$ is preferably designed to be a value on the order of 1/1000 to 1/200 of $I_B$. [Condition 2]

The auxiliary current $I_{AUX}$ is designed to be smaller than the charging current $I_A$ that flows to the internal line 201 in the off period of the output transistor $M_H$ in the non-low-voltage state. The current $I_A$ is mainly configured as a current that flows through the third transistor $M_3$. With this arrangement, the auxiliary current $I_{AUX}$ has no effect on the turn-off operation.

$$I_{AUX} < I_A$$

Furthermore, the auxiliary current $I_{AUX}$ is designed to be larger than the current $I_{R(Low)}$ that flows to the internal line 201 in the on period of the output transistor $M_H$ in the low-voltage state. The current $I_{R(Low)}$ is mainly configured as a current that flows through the impedance element $R_1$.

$$I_{AUX} > I_{R(Low)}$$

Usage

Figure 13:
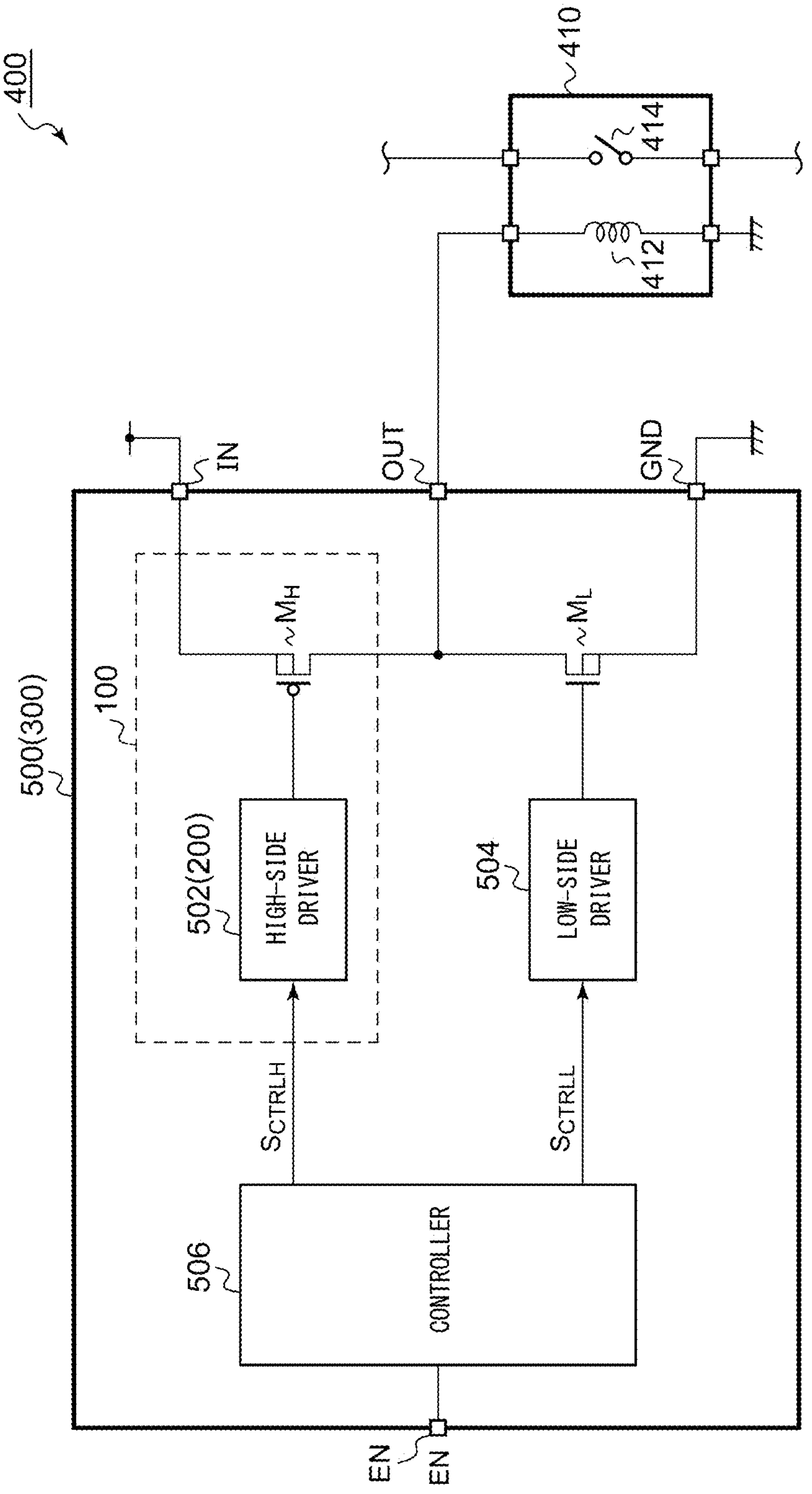
FIG. 13 is a block diagram showing a relay apparatus.

Next, description will be made regarding the usage of the output circuit 100. The above-described semiconductor apparatus (output circuit) may be employed in a mechanical relay driving circuit. FIG. 13 is a block diagram showing a relay apparatus 400. The relay apparatus 400 is employed in vehicles, consumer electronics devices, industrial equipment, transportation equipment, and agricultural equipment, for example. The relay apparatus 400 is employed to control the disconnection/conduction state of a power line for a large current.

The relay apparatus 400 includes a mechanical relay 410 and a driving apparatus 500 for the mechanical relay 410. The relay apparatus 400 may be configured as a module.

The mechanical relay 410 includes a coil 412 and a switch 414. The driving circuit 500 corresponds to the above-described semiconductor apparatus 300, and includes a high-side transistor $M_H$, a low-side transistor $M_L$, a high-side driver 502, a low-side driver 504, and a controller 506. The high-side transistor $M_H$ and the low-side transistor $M_L$ form a half-bridge circuit. The controller 506 generates control signals $S_{CTRLH}$ and $S_{CTRLL}$ for the high-side transistor $M_H$ and the low-side transistor $M_L$, respectively, according to an external control signal EN. The high-side transistor $M_H$ and the high-side driver 502 correspond to the above-described output circuit 100. The high-side driver 502 corresponds to the above-described driving circuit 200, and drives the high-side transistor $M_H$ according to the control signal $S_{CTRLH}$. The low-side driver 504 drives the low-side transistor $M_L$ according to the control signal $S_{CTRLL}$.

Figure 14:
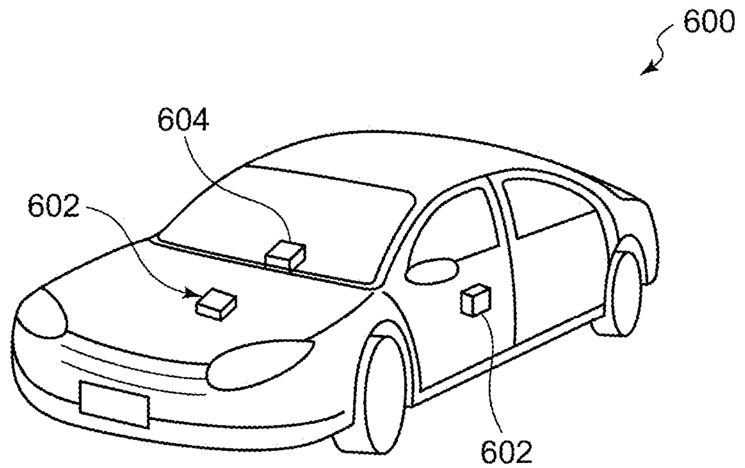
FIG. 14 is a perspective view of a vehicle including a relay apparatus.

FIG. 14 is a perspective view of a vehicle 600 including the relay apparatus 400. The vehicle 600 includes multiple relays 602, 604, and 606. A given relay 602 is employed for operating a wiper or washer. Another relay 604 is employed for operating a power window, a door lock, or a power sliding door. Yet another relay 606 is employed for operating a headlight, a starter, or the like.

Description has been made above regarding the present invention with reference to the embodiments. The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Modification 1.1

Description has been made in the embodiments 1 through 3 regarding the semiconductor apparatus configured including MOSFETs. However, the present invention is not restricted to such an arrangement. Also, a desired MOSFET may be replaced by a bipolar transistor or the like. In this case, the gate, source, and drain in the above description correspond to the base, emitter, and drain, respectively.

Modification 1.2

Description has been made in the embodiments 1 through 3 regarding an arrangement in which the output transistor $M_H$ is integrated in the semiconductor apparatus 300. However, the present invention is not restricted to such an arrangement. Also, as the output transistor $M_H$, a discrete element may be employed.

Modification 1.3

The usage of the semiconductor apparatus 300 is not restricted to such a relay driving circuit. Also, the semiconductor apparatus 300 may be employed in switching power supplies such as DC/DC converters, motor driving circuits (inverters), AC/DC converters, DC/AC converters (inverters), charging/discharging systems for secondary batteries, power conditioners, etc.

Modification 1.4

Description has been made in the embodiments 1 through 3 regarding an aspect of the present invention as a technique for suppressing an increase in the on resistance in the low-voltage state (voltage reduction state). However, the present invention is not restricted to such an arrangement. The present invention is effectively employed in an application used in a state in which the input voltage $V_{IN}$ is high (non-low-voltage state). That is to say, with the source follower voltage source 6 as shown in FIG. 1, the following relation holds true.

$$V_{REGB} = V_{BIAS} + V_{TH}$$

Accordingly, a voltage that is higher than the bias voltage $V_{BIAS}$ by the gate-source voltage $V_{TH}$ of the transistor $M_1$ is applied as the gate voltage $V_G$ of the output transistor $M_H$ in the on period regardless of whether the input voltage $V_{IN}$ is high or low. In other words, it can be understood that the gate-source voltage $V_{GS}$ of the output transistor $M_1$ becomes lower by $V_{TH}$. The present invention can be widely employed in a case in which the effect of $V_{TH}$ is preferably reduced regardless of whether the input voltage $V_{IN}$ is high or low (e.g., in a case in which a constant voltage $V_Z$ that is sufficiently larger than the threshold value $V_{GS(th)}$ of the output transistor cannot be generated, or the like).

Embodiment 4

Figure 15:
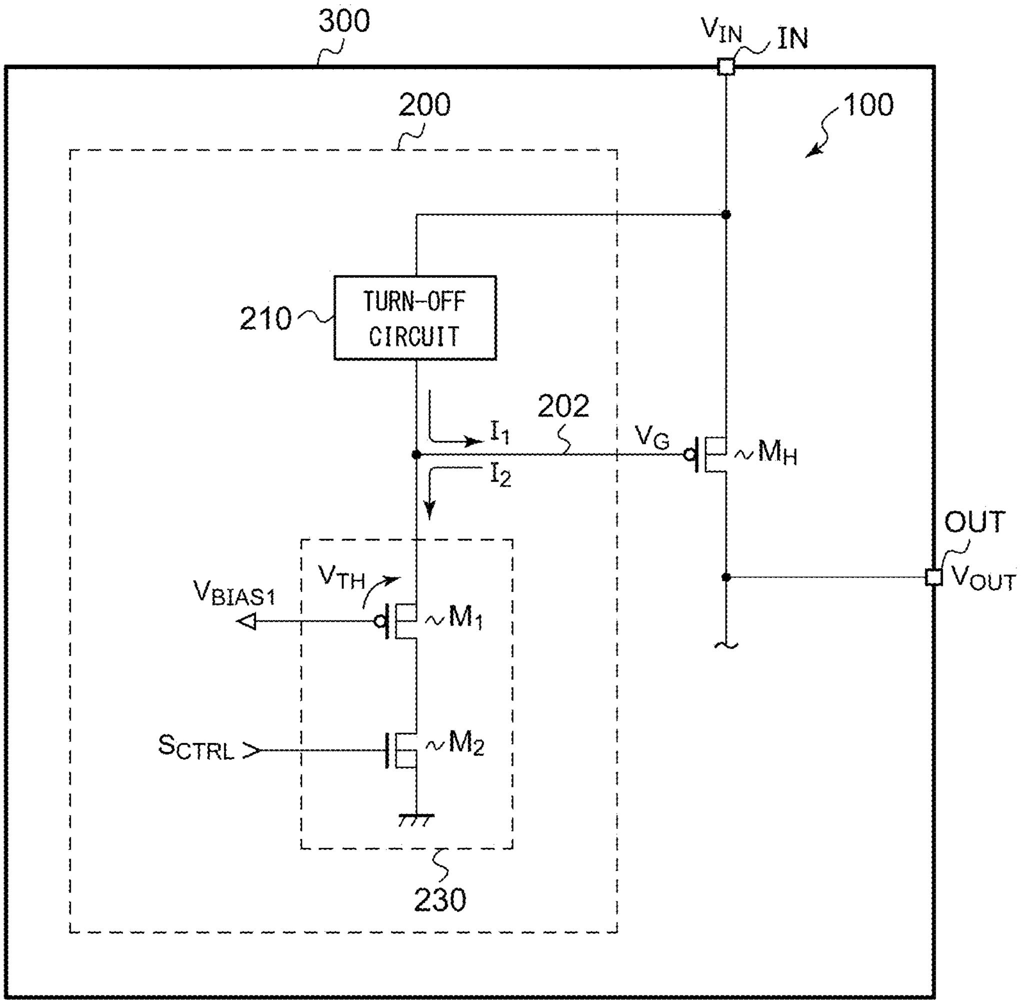
FIG. 15 is a circuit diagram showing an output circuit according to an embodiment 4.

FIG. 15 is a circuit diagram showing an output circuit 100 according to an embodiment 4. The output circuit 100 includes an output transistor $M_H$ and a driving circuit 200. In the present embodiment, the output circuit 100 is configured as a component of a function IC (semiconductor apparatus 300) integrated on a single semiconductor substrate.

The output transistor $M_H$ may be configured as an upper arm of a half-bridge circuit (single-phase inverter). Alternatively, the output transistor $M_H$ may be configured as an upper arm of a given leg of a full-bridge circuit or three-phase inverter. The output terminal OUT may be coupled to an inductive element such as an inductor, transformer, motor coil, relay coil, or the like. Also, the output transistor $M_H$ may be configured as a switching transistor of a step-down converter (buck converter).

The output transistor $M_H$ is arranged between the input terminal IN and the output terminal OUT. The output transistor $M_H$ is configured as a P-channel MOSFET, and is arranged such that its source is coupled to the input terminal IN and its drain is coupled to the output terminal OUT. The output transistor $M_H$ may be configured as a GaN FET, IGBT (Insulated Gate Bipolar Transistor), or PNP bipolar transistor.

The driving circuit 200 drives the output transistor $M_H$ according to the control signal $S_{CTRL}$. Specifically, when the control signal $S_{CTRL}$ is set to the on level (e.g., high level), the driving circuit 200 turns on the output transistor $M_H$. When the control signal $S_{CTRL}$ is set to the off level (e.g., low level), the driving circuit 200 turns off the output transistor $M_H$. Typically, the control signal $S_{CTRL}$ is configured as a pulse signal. However, the present invention is not restricted to such an arrangement. Also, the control signal $S_{CTRL}$ may be configured as a DC signal. The output voltage $V_{OUT}$ is supplied to the output terminal OUT according to the control signal $S_{CTRL}$. Specifically, when the output transistor $M_H$ is turned on, the output voltage $V_{OUT}$ is set to the input voltage $V_{IN}$. When the output transistor $M_H$ is turned off, the output terminal OUT is set to the ground voltage $V_{GND}$ or otherwise the high-impedance state.

The driving circuit 200 includes a turn-off circuit 210 and a turn-on circuit 230. In the off period of the output transistor $M_H$, the turn-off circuit 210 supplies a charging current to a control electrode (gate) of the output transistor $M_H$ so as to raise the gate voltage $V_G$ of the output transistor $M_H$, which turns off the output transistor $M_H$.

The turn-on circuit 230 includes a first transistor $M_1$ and a second transistor $M_2$. The first transistor $M_1$ is configured as a P-channel MOSFET, and is arranged such that its first electrode (source) is coupled to a control electrode (gate) of the output transistor $M_H$, and such that a bias voltage $V_{BIAS1}$ is supplied to its control electrode (gate). The bias voltage $V_{BIAS1}$ may be configured as a constant voltage. In this case, the first transistor $M_1$ operates as a source follower clamp circuit, which clamps the voltage $V_G$ of the gate line 202 with $V_L = V_{BIAS1} + V_{TH}$ as a lower limit. Here, $V_L$ will be referred to as the "clamp level". In this example, the relation $V_L < V_{IN} - V_{G(th)}$ holds true.

The second transistor $M_2$ is configured as an N-channel MOSFET, and is arranged between a second electrode (drain) of the first transistor $M_1$ and the ground. The second transistor $M_2$ is controlled such that it is turned on when the control signal $S_{CTRL}$ is set to the on level (high level).

The above is the configuration of the output circuit 100. Next, description will be made regarding the operation thereof.

When the control signal $S_{CTRL}$ is set to the off level, the second transistor $M_2$ of the turn-on circuit 230 is set to the off state. Accordingly, the discharging current $I_2$ that flows from the gate line 202 to the ground is zero. A charging current $I_1$ is supplied from the turn-off circuit 210 to the gate of the output transistor $M_H$, so as to raise the gate voltage $V_G$ to a value in the vicinity of the input voltage $V_{IN}$. As a result, the output transistor $M_H$ is turned off.

When the control signal $S_{CTRL}$ is set to the on level, the second transistor $M_2$ of the turn-on circuit 230 is turned on. In this state, the discharging current $I_2$ flows from the gate line 202 via the first transistor $M_1$ and the second transistor $M_2$. The gate capacitance is discharged by the discharging current $I_2$, which lowers the gate voltage by the discharging current $I_2$. When the gate-source voltage $V_{GS}$ exceeds the threshold value $V_{GS(th)}$, the output transistor $M_H$ is turned on. When the gate voltage $V_G$ has lowered to the clamp level $V_L$, the gate voltage $V_G$ is clamped at the clamp level L by the first transistor $M_1$.

The above is the operation of the output circuit 100. With the output circuit 100, the discharging current $I_2$ to be generated in the turn-on operation of the output transistor $M_H$ flows to the ground. That is to say, the discharging current $I_2$ does not flow to a node where the bias voltage $V_{BIAS1}$ is generated. This arrangement is capable of preventing fluctuation of the bias voltage $V_{BIAS1}$ that corresponds to the power supply voltage $V_{REGB}$ shown in FIG. 1, thereby preventing fluctuation of the clamp level $V_L$. Accordingly, this arrangement does not require a capacitor or otherwise requires only a small-capacitance capacitor for stabilizing the bias voltage $V_{BIAS1}$ (clamp level $V_L$).

Example 4.1

Figure 16:
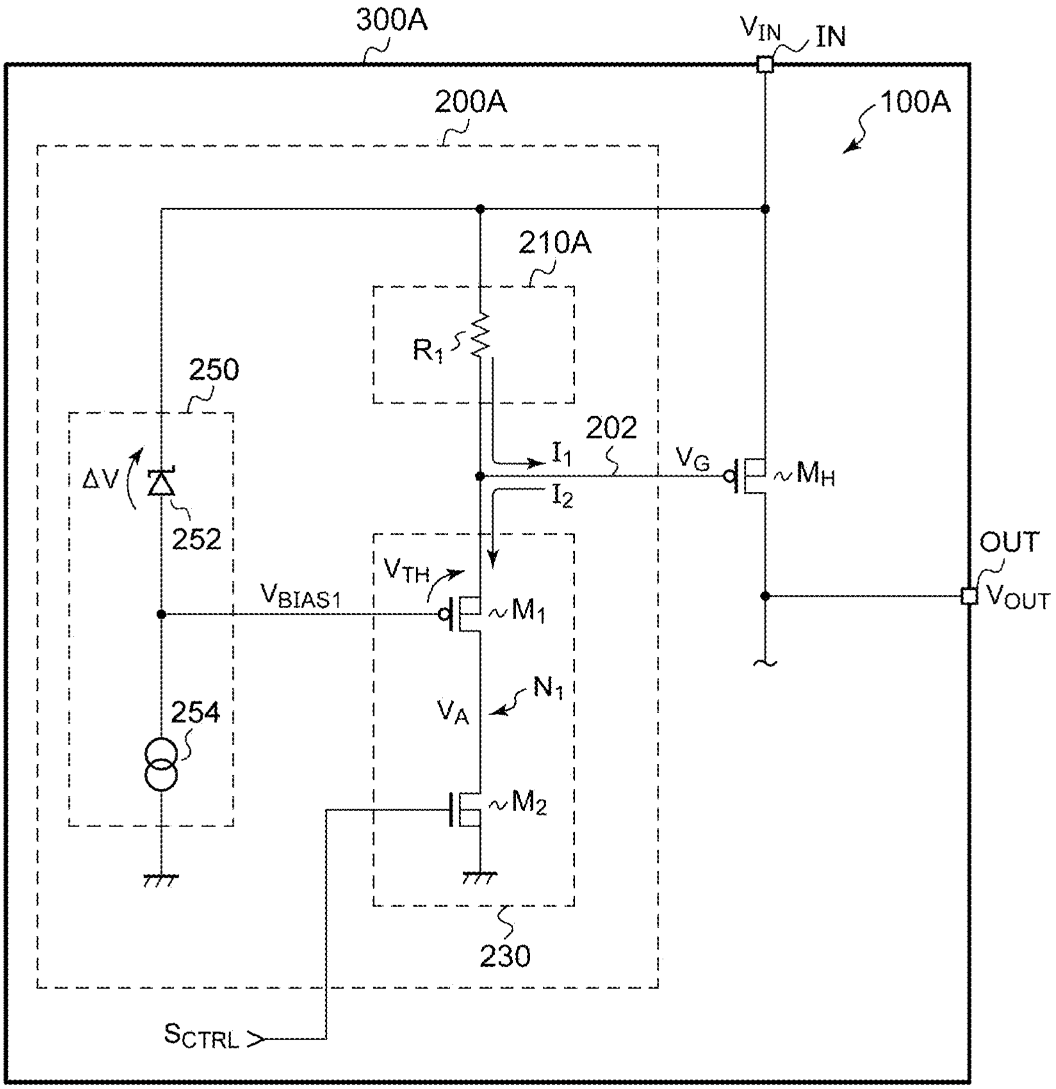
FIG. 16 is a circuit diagram showing a semiconductor apparatus including an output circuit according to an example 4.1.

FIG. 16 is a circuit diagram showing a semiconductor apparatus 300A including an output circuit 100A according to an example 4.1. A turn-off circuit 210A includes a first resistor $R_1$ arranged between an input terminal IN and the gate of an output transistor $M_H$ (gate line 202).

A driving circuit 200A further includes a first voltage source 250. The first voltage source 250 supplies a bias voltage $V_{BIAS1}$ to the gate of a first transistor $M_1$. The bias voltage $V_{BIAS1}$ is configured as a voltage that is lower than the input voltage $V_{IN}$ than a predetermined voltage width $\Delta V$. The predetermined voltage width $\Delta V$ is defined such that the relation $\Delta V > V_{GS(th)} + V_{TH}$ holds true. The first voltage source 250 includes a first constant voltage element 252 and a first current source 254, for example. The first constant voltage element 252 includes a Zener diode or a diode which provides a constant voltage $\Delta V$ across both ends thereof.

Figure 17:
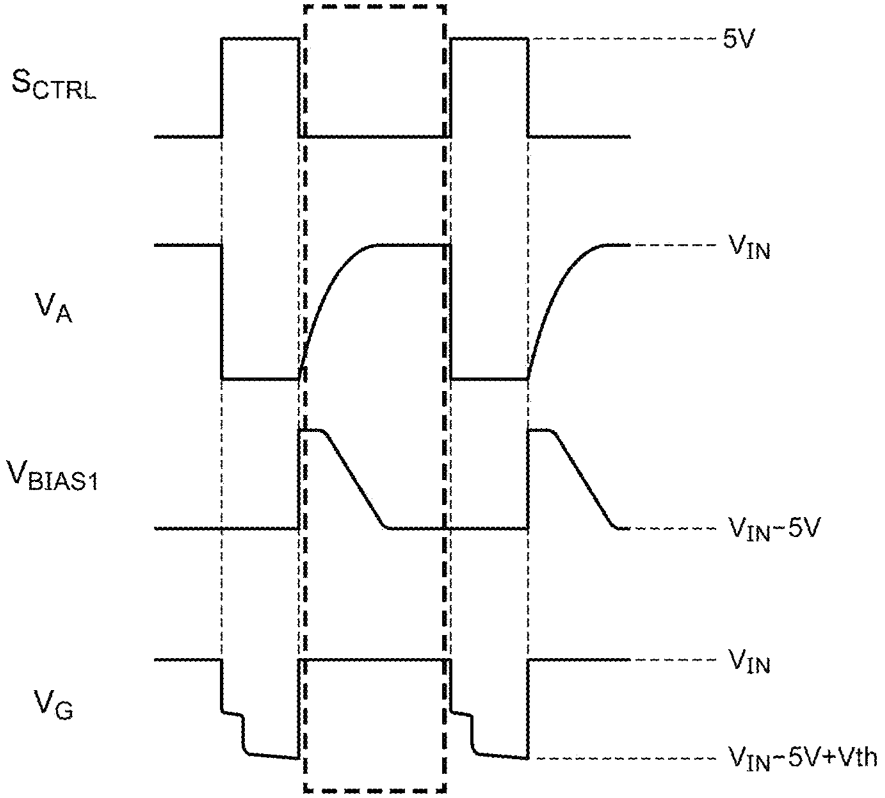
FIG. 17 is an operation waveform diagram showing the operation of the output circuit shown in FIG. 16.

The above is the configuration of the output circuit 100A. Next, description will be made regarding the operation thereof. FIG. 17 is an operation waveform diagram showing the operation of the output circuit 100A shown in FIG. 16.

In a period in which the control signal $S_{CTRL}$ is set to the high level, the second transistor $M_2$ is turned on. In this state, the voltage $V_A$ at a connection node $N_1$ that couples the second transistor $M_2$ and the first transistor $M_1$ comes to be the ground voltage $V_{GND}$. When the second transistor $M_2$ is turned on, a charging current $I_2$ is drawn from the gate of the output transistor $M_H$ via the first transistor $M_1$ and the second transistor $M_2$. As a result, the gate voltage $V_G$ of the output transistor $M_H$ comes to be a value represented by $V_L = V_{IN} - \Delta V + V_{TH}$. In this state, the output transistor $M_H$ is turned on. FIG. 17 shows an example in which $\Delta V = 5$ V.

In a period in which the control signal $S_{CTRL}$ is set to the low level, the second transistor $M_2$ is turned off. In this state, the discharging current $I_2$ comes to be zero. The gate voltage $V_G$ of the output transistor $M_H$ is pulled up by a first resistor $R_1$. The gate capacitance of the output transistor $M_H$ is charged by the charging current $I_1$ that flows via the first resistor $R_1$, which raises the gate voltage $V_G$ to the input voltage $V_{IN}$. As a result, the output transistor $M_H$ is turned off. In this state, the electric potential $V_A$ at the node $N_1$ approaches the input voltage $V_{IN}$. The fluctuation of the drain voltage $V_A$ of the first transistor $M_1$ causes fluctuation of the gate voltage of the first transistor $M_1$, i.e., fluctuation of the bias voltage $V_{BIAS1}$. It should be noted that the bias voltage $V_{BIAS1}$ is used only in the on period of the output transistor $M_H$. Accordingly, the fluctuation of the bias voltage $V_{BIAS1}$ has no effect on the circuit operation.

The example 4.1 has an advantage of requiring only a simple configuration to provide the output circuit 100 shown in FIG. 15. However, the output circuit 100A has the following tradeoff problem. The through rate (slope) of the gate voltage $V_G$ in the turn-off operation of the first transistor $M_1$ is determined by the resistance value of the first resistor $R_1$.

With an application that requires a high-speed switching operation, the first resistor $R_1$ is required to have a small resistance value. However, even in the on period of the output transistor $M_H$, the charging current $I_1$ continues to flow through the first resistor $R_1$. The charging current $I_1$ flows as a wasted current to the ground via the first transistor $M_1$ and the second transistor $M_2$, leading to wasted power consumption.

That is to say, with the example 4.1, there is a tradeoff relation between the through rate in the turn-on operation of the first transistor $M_1$ and the power consumption. In some cases, it is difficult to employ such an example for an application that requires both high-speed operation and low power consumption. Description will be made regarding an output circuit that supports both high-speed operation and the low power consumption.

Example 4.2

Figure 18:
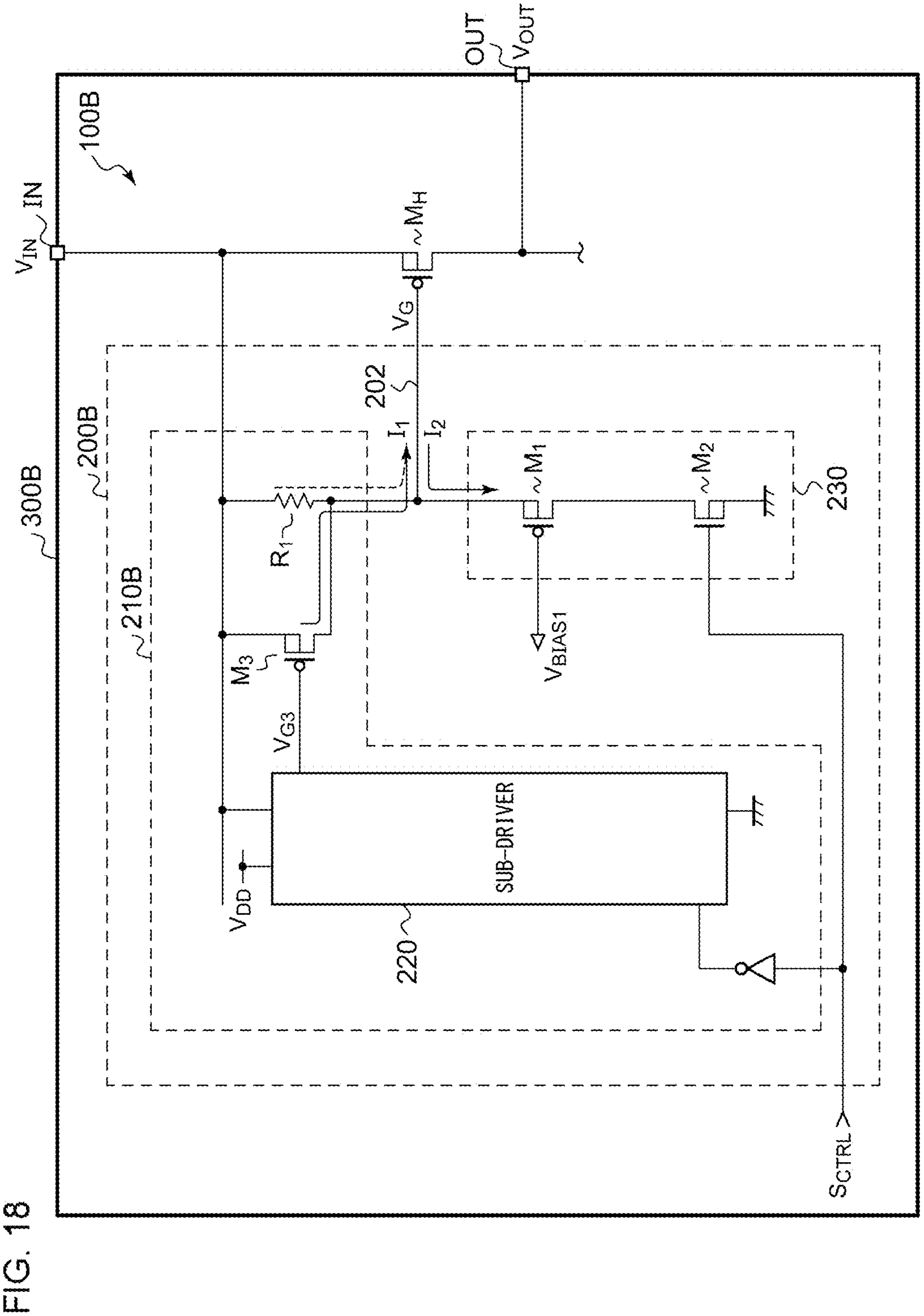
FIG. 18 is a circuit diagram showing a semiconductor apparatus including an output circuit according to an example 4.2.

FIG. 18 is a circuit diagram showing a semiconductor apparatus 300B including an output circuit 100B according to an example 4.2. A turn-off circuit 210B further includes a third transistor $M_3$ and a sub-driver 220 in addition to the first resistor $R_1$. The third transistor $M_3$ is configured as a P-channel MOSFET, which is arranged between the input terminal IN and the gate line 202.

In the off period of the output transistor $M_H$ (in the period in which $S_{CTRL}$ is set to the low level), the sub-driver 220 turns on the third transistor $M_3$. For example, the sub-driver 220 level-shifts a control signal $S_{CTRL}$ that switches between $V_{DD}$ and $V_{GND}$ to a gate signal $V_{G3}$ that switches between an appropriate high voltage and low voltage (e.g., between $V_{IN}$ and $V_{REGB}$). The low voltage $V_{REGB}$ may be the same as the low voltage of the gate voltage $V_G$ of the output transistor $M_H$.

With this arrangement, the charging current $I_1$ to be applied to the gate capacitance of the output transistor $M_H$ can be generated by means of the third transistor $M_3$. This allows the output transistor $M_H$ to turn off with high speed. This arrangement allows the first resistor $R_1$ to have a sufficiently high resistance value. Accordingly, this allows the current that flows through the first resistor $R_1$ to have a small current value, thereby allowing wasted power consumption to be reduced. As described above, with the output circuit 100B shown in FIG. 18, this arrangement is capable of providing both high-speed operation and low power consumption.

Figure 19:
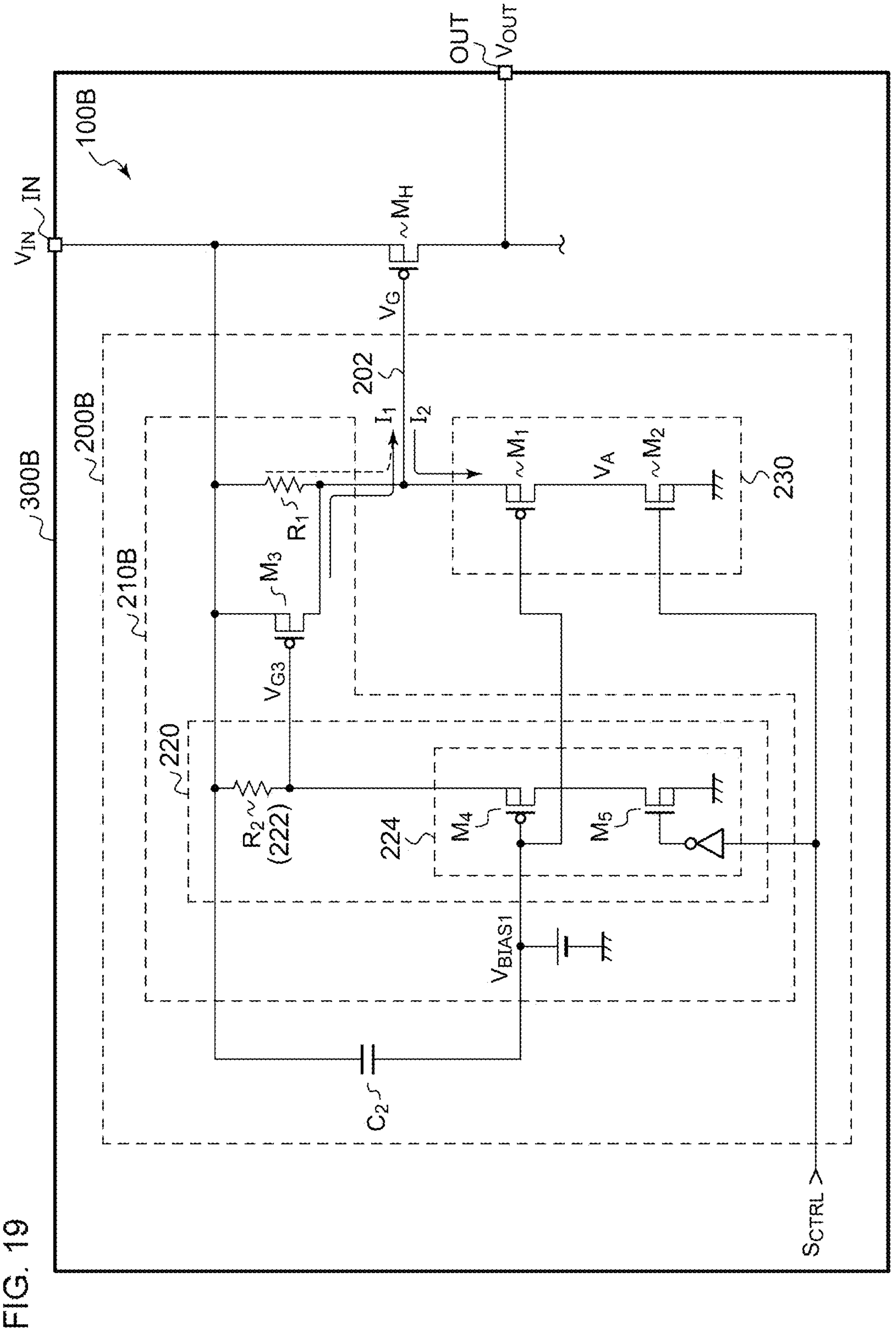
FIG. 19 is a circuit diagram showing a specific example configuration of the output circuit shown in FIG. 18.

FIG. 19 is a circuit diagram showing a specific example configuration of the output circuit 100B shown in FIG. 18. The sub-driver 220 is configured in the same manner as the driving circuit 200 shown in FIG. 15. Specifically, the sub-driver 220 may include a turn-off circuit 222 and a turn-on circuit 224.

More specifically, the sub-driver 220 can be configured in the same manner as with the driving circuit 200A shown in FIG. 16. That is to say, the sub-driver 220 includes a second resistor $R_2$ that corresponds to the turn-off circuit 222 and a fourth transistor $M_4$ and a fifth transistor $M_5$ that form the turn-on circuit 224. The bias voltage $V_{BIAS1}$ is supplied to the gate of the fourth transistor $M_4$. The bias voltage $V_{BIAS1}$ is generated by the first constant voltage element 252 and the first current source 254 as with the arrangement shown in FIG. 16.

An inverted signal # $S_{CTRL}$ of the control signal $S_{CTRL}$ is input to the gate of the fifth transistor $M_5$. In the off period of the output transistor $M_H$ (in a period in which $S_{CTRL}$ is set to the low level), the inverted signal # $S_{CTRL}$ is set to the on state. The operation of the sub-driver 220 shown in FIG. 19 is the same as that of the driving circuit 200A shown in FIG. 16. The gate voltage $V_{G3}$ of the third transistor $M_3$ is switched between two values, i.e., between the high level configured as $V_{IN}$ and the low level configured as $V_L$ represented by $V_L = V_{BIAS1} + V_{TH}$.

As described with reference to FIG. 17, when the control signal $S_{CTRL}$ is set to the low level, the second transistor $M_2$ is turned off. The turn-off of the second transistor $M_2$ leads to fluctuation of the drain voltage $V_A$ thereof. Furthermore, this causes fluctuation of the bias voltage $V_{BIAS1}$ due to the effect of fluctuation of the gate capacitance of the first transistor $M_1$. The bias voltage $V_{BIAS1}$ is also supplied to the gate of the fourth transistor $M_4$. In this state, when the fifth transistor $M_5$ is turned on, the fluctuation of the gate voltage $V_{BIAS1}$ of the fourth transistor $M_4$ leads to fluctuation of the gate voltage $V_{G3}$ of the third transistor $M_3$. This has adverse effects on the turn-off operation (through rate etc.) of the output transistor $M_H$.

Conversely, when the fifth transistor $M_5$ is turned off, this leads to fluctuation of the gate voltage of the fourth transistor $M_4$ (i.e., bias voltage $V_{BIAS1}$) due to the effect of the gate capacitance of the fourth transistor $M_4$. In this state, when the second transistor $M_2$ is turned on, the fluctuation of the gate voltage $V_{BIAS1}$ of the first transistor $M_1$ leads to fluctuation of the gate voltage $V_G$ of the output transistor $M_H$. This has adverse effects on the turn-on operation of the output transistor $M_H$.

Accordingly, in a case in which the fluctuation of the bias voltage $V_{BIAS1}$ is too large to be allowed, there is a need to provide an additional smoothing capacitor $C_2$ so as to reduce the fluctuation.

Example 4.3

Figure 20:
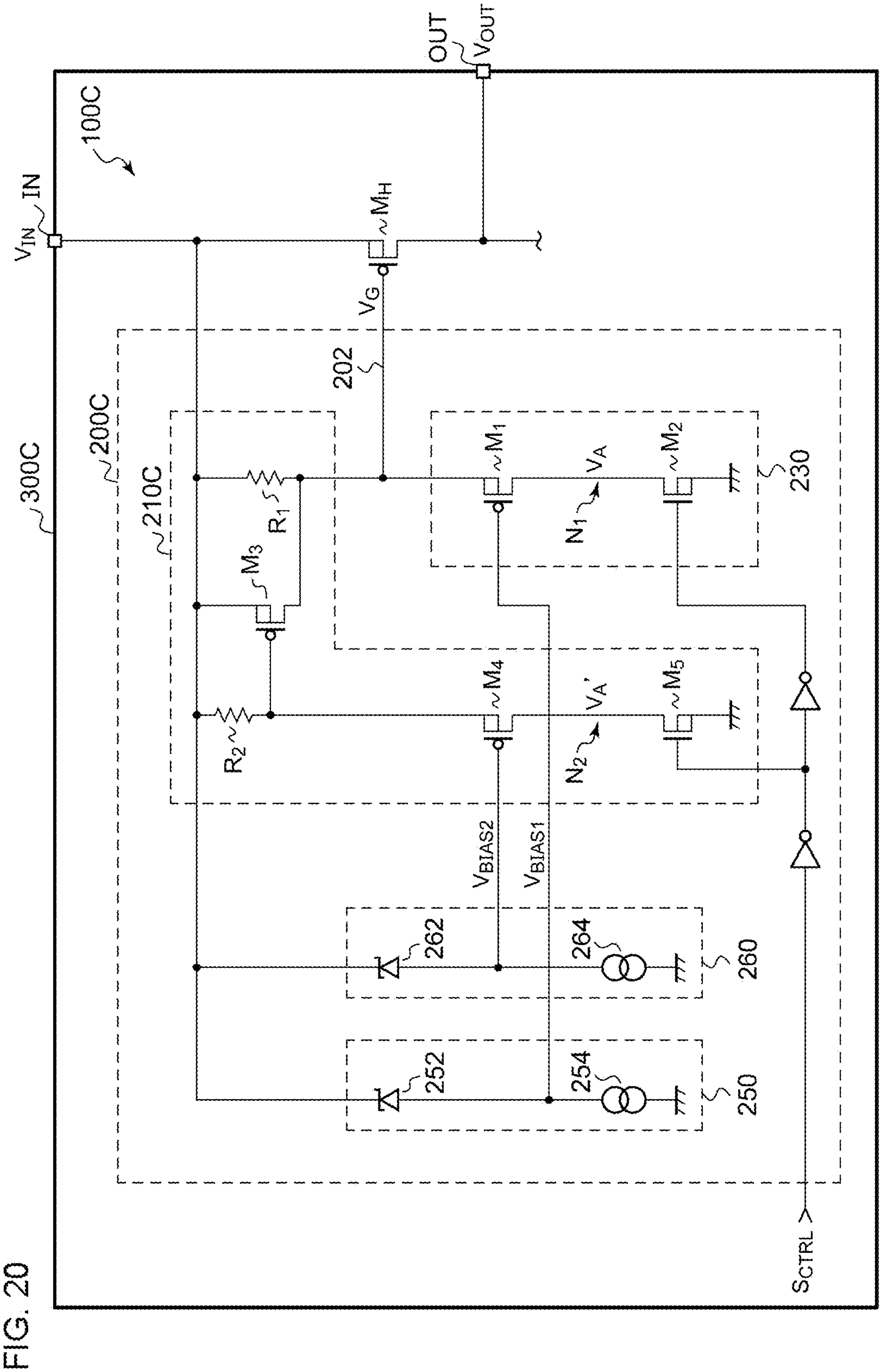
FIG. 20 is a circuit diagram showing a semiconductor apparatus including an output circuit according to an example 4.3.

FIG. 20 is a circuit diagram showing a semiconductor apparatus 300C including an output circuit 100C according to an example 4.3. With the example 4.2 (FIG. 19), the first transistor $M_1$ and the fourth transistor $M_4$ are biased by a common voltage source. In contrast, in the example 4.3, the first transistor $M_1$ and the fourth transistor $M_4$ are biased by different respective voltage sources. Specifically, the driving circuit 200C includes a first voltage source 250 and a second voltage source 260. The second voltage source 260 has the same configuration as that of the first voltage source 250, and includes a second constant voltage element 262 and a second current source 264.

Figure 21:
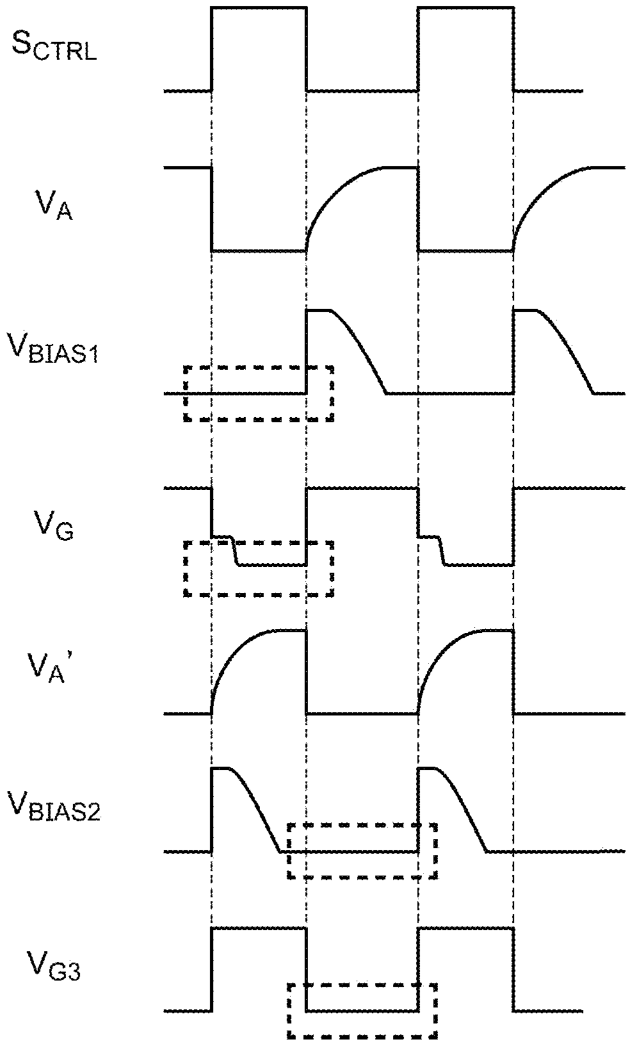
FIG. 21 is an operation waveform diagram showing the operation of the output circuit shown in FIG. 20.

The above is the configuration of the output circuit 100C. Next, description will be made regarding the operation thereof. FIG. 21 is an operation waveform diagram showing the operation of the output circuit 100C shown in FIG. 20. The turn-on circuit 230 and the sub-driver 220 operate in a complementary manner. Accordingly, the two voltages $V_A$ and $V_A'$ at the respective nodes $N_1$ and $N_2$ change in a complementary manner. Accordingly, the bias voltages $V_{BIAS1}$ and $V_{BIAS1}'$ also change in a complementary manner. The bias voltage $V_{BIAS1}$ is used in a period in which the second transistor $M_2$ is turned on, i.e., in the on period in which the control signal $S_{CTRL}$ is set to the high level. In the on period, the bias voltage $V_{BIAS1}$ is stable. Similarly, the bias voltage $V_{BIAS2}$ is used in a period in which the fifth transistor $M_5$ is turned on, i.e., in the off period in which the control signal $S_{CTRL}$ is set to the low level. In the off period, the bias voltage $V_{BIAS2}$ is stable.

With the output circuit 100C, fluctuations of the bias voltages $V_{BIAS1}$ and $V_{BIAS2}$ have no effect on the low levels of the gate voltages $V_G$ and $V_{G3}$ of the output transistor $M_H$ and the third transistor $M_3$. Accordingly, such an arrangement does not require such a capacitor $C_2$ shown in FIG. 19, thereby allowing the circuit area to be reduced.

Example 4.4

Figure 22:
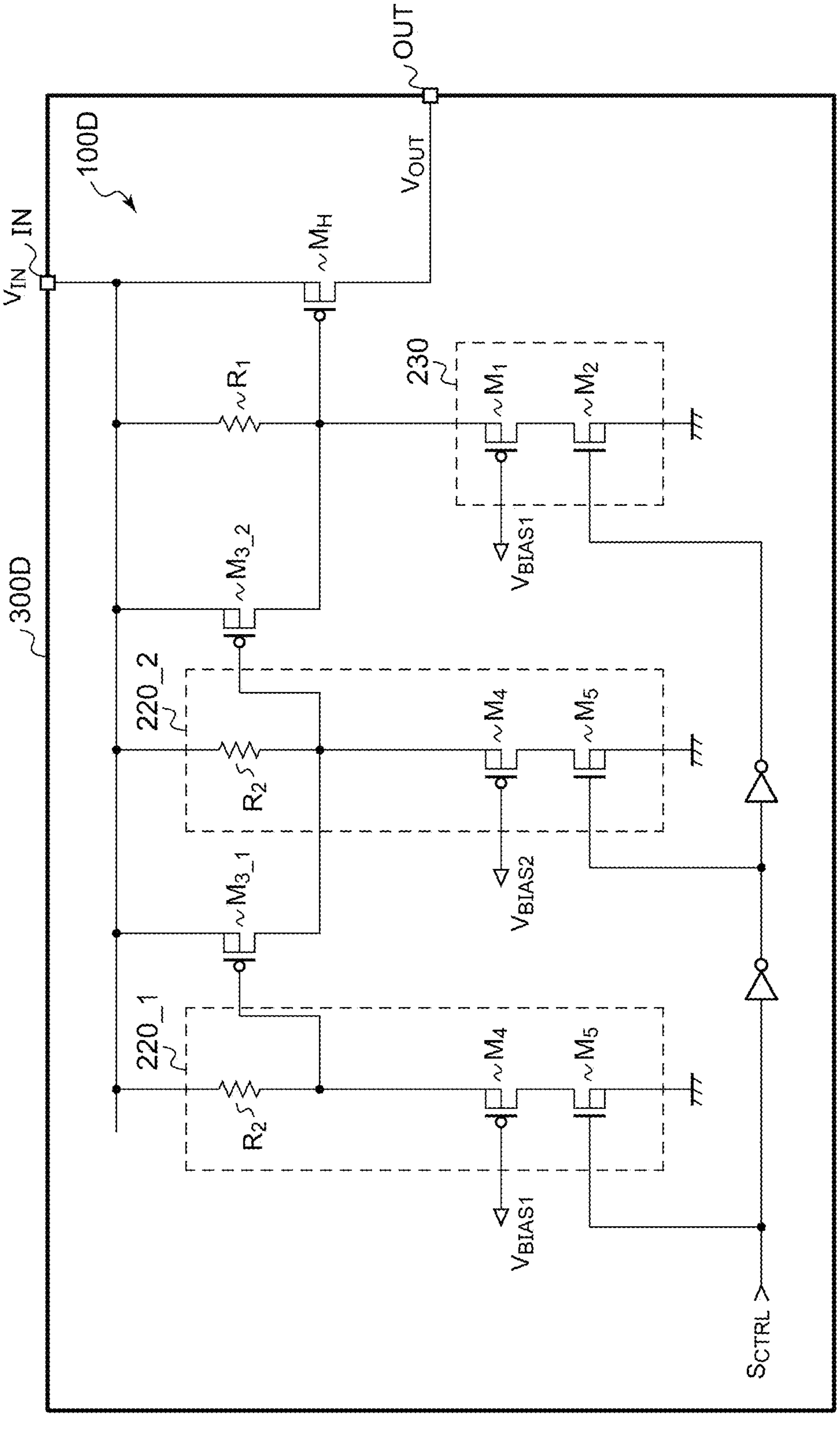
FIG. 22 is a circuit diagram showing a semiconductor apparatus including an output circuit according to an example 4.4.

FIG. 22 is a circuit diagram showing a semiconductor apparatus 300D including an output circuit 100D according to an example 4.4. With the circuits shown in FIGS. 19 and 20, the gate capacitance of the third transistor $M_3$ is charged by means of the second resistor $R_2$. Accordingly, in a case in which the third transistor $M_3$ is configured to have a large size (W/L), this can lead to the same problem as in the driving circuit 200A shown in FIG. 16, i.e., a problem in that this arrangement is not capable of providing the driving operation of the third transistor $M_3$ with both high-speed operation and low power consumption.

In this example, two stages, each of which is configured of a third transistor $M_3$ and a sub-driver 220, are coupled in series. The third transistor $M_{3\_2}$ of the downstream stage is arranged between the input terminal IN and the gate of the output transistor $M_H$. The third transistor $M_{3\_1}$ of the upstream stage is arranged between the input terminal IN and the gate of the third transistor $M_{3\_2}$ of the immediately downstream stage.

When the control signal $S_{CTRL}$ is set to the high level, the sub-driver 220_1 turns on the third transistor $M_{3\_1}$. Conversely, when the control signal $S_{CTRL}$ is set to the low level, the sub-driver 220_1 turns off the third transistor $M_{3\_1}$. The sub-drivers 220_1 and 220_2 each have the same configuration. The gate of the fourth transistor $M_{4\_1}$ of the sub-driver 220_1 and the gate of the first transistor $M_1$ are set to the same bias state.

Fifth Embodiment

Figure 23:
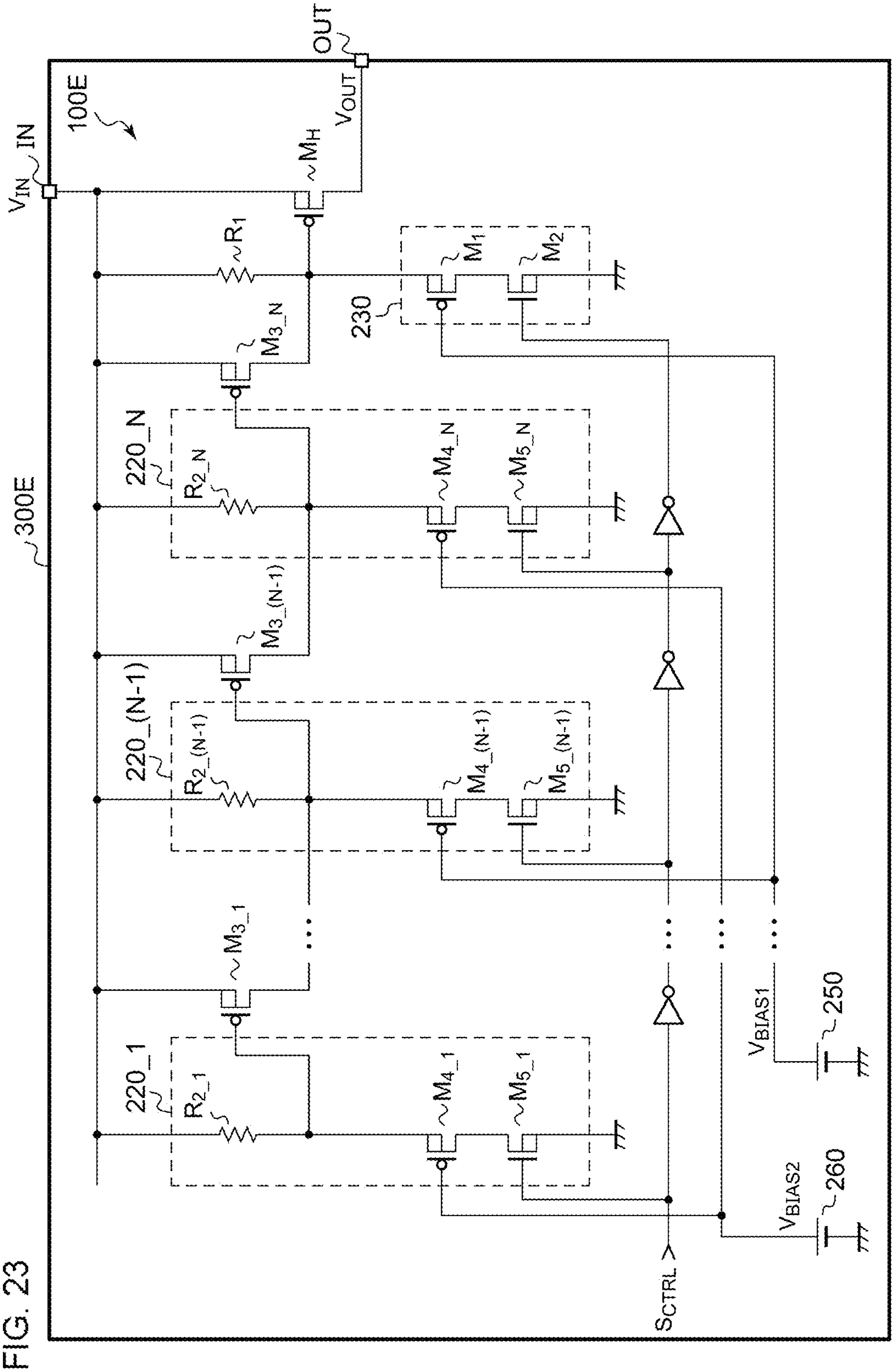
FIG. 23 is a circuit diagram showing a semiconductor apparatus including an output circuit according to an example 4.5.

FIG. 23 is a circuit diagram showing a semiconductor apparatus 300E including an output circuit 100E according to a fifth embodiment. The fifth embodiment has a multi-stage configuration having a greater number of stages than the output circuit 100D shown in FIG. 22. An output circuit 100E is provided with multiple (N) third transistors $M_{3\_1}$ through $M_{3\_N}$ and multiple (N) stages of sub-drivers 220_1 through 220_N, which are coupled in a cascade manner. The multiple third transistors $M_3$ and elements that form the multiple sub-drivers 220 are each designed to have a size (driving capacity) that is increased in ascending order of the stages.

The multiple sub-drivers 220_1 through 220_N are each configured in the same manner. The i-th sub-driver 220_*i* ($1 \le i \le N$) drives the corresponding third transistor $M_{3\_i}$. The third transistor $M_{3\_N}$ of the last stage is arranged between the input terminal IN and the gate of the output transistor $M_H$. The other third transistors $M_{3\_j}$ ($1 \le j \le N-1$) of the upstream stages thereof are each arranged between the input terminal IN and the gate of the third transistor $M_{3\_(j+1)}$ of the immediately downstream stage.

The first transistor $M_1$ and the fourth transistors $M_{4\_N}$, $M_{4\_(N-2)}$, . . . , grouped for every two stages, are each biased by a common voltage source 250. The other fourth transistors $M_{4\_(N-1)}$, $M_{4\_(N-3)}$ . . . , are each biased by a different common voltage source 260.

Usage

Next, description will be made regarding the usage of the output circuit 100. The above-described semiconductor apparatus (output circuit) may be employed in a mechanical relay driving circuit. Such a relay apparatus and a vehicle including the relay apparatus have the same configurations and operations as those described with reference to FIGS. 13 and 14.

Modification 4.1

Description has been made in the embodiment 4 regarding the semiconductor apparatus configured including MOSFETs. However, the present invention is not restricted to such an arrangement. Also, a desired MOSFET may be replaced by a bipolar transistor or the like. In this case, the gate, source, and drain in the above description correspond to the base, emitter, and drain, respectively.

Modification 4.2

Description has been made in the embodiment 4 regarding an arrangement in which the output transistor $M_H$ is integrated in the semiconductor apparatus 300. However, the present invention is not restricted to such an arrangement. Also, as the output transistor $M_H$, a discrete element may be employed.

Modification 4.3

The usage of the semiconductor apparatus 300 is not restricted to such a relay driving circuit. Also, the semiconductor apparatus 300 may be employed in switching power supplies such as DC/DC converters, motor driving circuits (inverters), AC/DC converters, DC/AC converters (inverters), charging/discharging systems for secondary batteries, power conditioners, etc.

Description has been made regarding the present invention with reference to the embodiments using specific terms. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

What is claimed is:

1. A driving circuit structured to drive an output transistor arranged between an input terminal to be coupled to receive an input voltage and an output terminal according to a control signal, the driving circuit comprising:

an internal line;

a first transistor having a control electrode such as a gate or a base being biased, and a first electrode such as a source or an emitter being coupled to the internal line; and a voltage correction circuit structured to control the internal line so as to gradually reduce a voltage of the internal line with time, wherein, in an on period of the output transistor, a voltage of the internal line is applied to the control electrode such as a gate or a base of the output transistor.

2. The driving circuit according to claim 1, wherein the voltage correction circuit comprises a current source that draws an auxiliary current as a sink current from the internal line.

3. The driving circuit according to claim 2, further comprising a driver comprising an upper-side power supply terminal coupled to the input terminal, a lower-side power supply terminal coupled to the internal line, and an output terminal coupled to the control electrode of the output transistor, and structured to drive the output transistor according to the control signal.

4. The driving circuit according to claim 3, wherein, in an on period of the output transistor, the auxiliary current is smaller than a sink current drawn by the driver from the control electrode of the output transistor.

5. The driving circuit according to claim 2, further comprising a third transistor arranged between the input terminal and the control electrode of the output transistor, and structured to turn on in a period in which the output transistor is to be turned off, wherein the auxiliary current is smaller than a current that flows through the third transistor in an off period of the output transistor.

6. The driving circuit according to claim 1, further comprising a second transistor arranged between a second electrode such as a drain or a collector of the first transistor and a ground, and structured to turn on and off according to the control signal.

7. The driving circuit according to claim 6, wherein the voltage correction circuit comprises a current source that draws an auxiliary current from the internal line, and in the on period of the output transistor, the auxiliary current is smaller than a sink current drawn from the control electrode of the output transistor via the second transistor.

8. The driving circuit according to claim 1, further comprising a clamp circuit structured to clamp a voltage of the internal line such that a voltage difference between the voltage of the internal line and the input voltage does not exceed a predetermined value.

9. The driving circuit according to claim 8, wherein the clamp circuit comprises a Zener diode arranged between the input terminal and the internal line.

10. The driving circuit according to claim 1, further comprising a bias circuit structured to supply a bias voltage that is lower than the input voltage by a predetermined voltage width to the control electrode of the first transistor.

11. A driving circuit structured to drive an output transistor arranged between an input terminal that receives an input voltage and an output terminal according to a control signal, the driving circuit comprising:

an internal line coupled to a control electrode such as a gate or a base of the output transistor;

a first transistor arranged having a control electrode such as a gate or a base being biased, and a first electrode such as a source or an emitter being coupled to the internal line;

a second transistor arranged between a second electrode such as a drain or a collector of the first transistor and a ground, and structured to turn on and off according to the control signal;

a current source structured to draw an auxiliary current as a sink current from the internal line; and an impedance element arranged between the input terminal and the internal line.

12. The driving circuit according to claim 11, wherein the auxiliary current is larger than a current that flows through the impedance element, and is smaller than a current that flows through the first transistor.

13. The driving circuit according to claim 11, further comprising a third transistor arranged between the input terminal and the internal line, and structured to turn on and off in a complementary manner with respect to the second transistor according to the control signal.

14. A driving circuit structured to drive an output transistor arranged between an input terminal that receives an input voltage and an output terminal according to a control signal, the driving circuit comprising:

an internal line;

a first transistor having a control electrode such as a gate or a base being biased, and a first electrode such as a source or an emitter being coupled to the internal line;

a driver comprising an upper-side power supply terminal coupled to the input terminal, a lower-side power supply terminal coupled to the internal line, and an output terminal coupled to a control electrode such as a gate or a base of the output transistor, and structured to drive the output transistor according to the control signal;

a current source structured to draw an auxiliary current as a sink current from the internal line; and an impedance element arranged between the input terminal and the internal line.

15. The driving circuit according to claim 14, wherein the auxiliary current is larger than a current that flows through the impedance element, and is smaller than a current that flows from the lower-side power supply terminal of the driver to the internal line.

16. A driving circuit structured to drive an output transistor arranged between an input terminal and an output terminal, the driving circuit comprising:

a first transistor arranged such that a first electrode thereof is coupled to a control electrode of the output transistor, and such that a control electrode thereof is biased;

a second transistor arranged between a second electrode of the first transistor and a ground, and structured to turn on in an on period of the output transistor;

a third transistor arranged between the input terminal and the control electrode of the output transistor; and a sub-driver structured to turn on the third transistor in an off period of the output transistor, wherein the sub-driver comprises:

a second resistor arranged between the input terminal and a control electrode of the third transistor;

a fourth transistor arranged such that a first electrode thereof is coupled to the control electrode of the third transistor, and such that a control electrode thereof is biased; and a fifth transistor arranged between a second electrode of the fourth transistor and the ground, and structured to turn on in the off period of the output transistor, and wherein the control electrode of the first transistor and the control electrode of the fourth transistor are biased by different voltage sources.

17. The driving circuit according to claim 16, further comprising a first resistor arranged between the input terminal and the control electrode of the output transistor.

18. The driving circuit according to claim 16, further comprising:

a first voltage source structured to supply a first bias voltage to the control electrode of the first transistor; and a second voltage source that is independent of the first voltage source, and that is structured to supply a second bias voltage to the control electrode of the fourth transistor, wherein the first voltage source and the second voltage source each have the same circuit configuration.

19. The driving circuit according to claim 18, wherein the first voltage source comprises a constant voltage element arranged between the input terminal and the control electrode of the first transistor, and wherein the second voltage source comprises a constant voltage element arranged between the input terminal and the control electrode of the fourth transistor.

20. The driving circuit according to claim 16, wherein a plurality of the third transistors and a plurality of sub-drivers are provided, wherein the fifth transistors of the plurality of sub-drivers grouped for every two stages are switched in a complementary manner, wherein the third transistor of a last stage is arranged between the input terminal and the control electrode of the output transistor, wherein the other third transistors of the upstream stages of the last stage are each arranged between the input terminal and the control electrode of the third transistor of the immediately downstream stage of the corresponding stage, wherein the control electrode of the first transistor and the control electrodes of the fourth transistors grouped for every two stages are each biased by a common first voltage source, and wherein the control electrodes of the other fourth transistors are each biased by another common second voltage source.

* * * * *